US008062828B2

(12) United States Patent
Ohsawa et al.

(10) Patent No.: US 8,062,828 B2
(45) Date of Patent: Nov. 22, 2011

(54) POSITIVE RESIST COMPOSITION AND PATTERNING PROCESS

(75) Inventors: Youichi Ohsawa, Joetsu (JP); Takeshi Kinsho, Joetsu (JP); Masaki Ohashi, Joetsu (JP); Seiichiro Tachibana, Joetsu (JP); Takeru Watanabe, Joetsu (JP); Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 174 days.

(21) Appl. No.: 12/370,652

(22) Filed: Feb. 13, 2009

(65) Prior Publication Data

US 2009/0202943 A1    Aug. 13, 2009

(30) Foreign Application Priority Data

Feb. 13, 2008    (JP) ................. 2008-031322

(51) Int. Cl.
G03F 7/039    (2006.01)
G03F 7/20    (2006.01)
G03F 7/30    (2006.01)
G03F 7/38    (2006.01)

(52) U.S. Cl. ............... 430/270.1; 430/326; 430/330; 430/907; 430/910; 430/942

(58) Field of Classification Search ............. None
See application file for complete search history.

(56) References Cited

U.S. PATENT DOCUMENTS

| 5,945,250 | A | 8/1999 | Aoai et al. |
| 6,048,672 | A | 4/2000 | Cameron et al. |
| 6,830,866 | B2 | 12/2004 | Kobayashi et al. |
| 6,849,374 | B2 | 2/2005 | Cameron et al. |
| 7,288,359 | B2 | 10/2007 | Iwasawa et al. |
| 7,449,573 | B2 | 11/2008 | Kodama et al. |
| 2002/0197558 | A1 | 12/2002 | Ferreira et al. |
| 2003/0113659 | A1 | 6/2003 | Hatakeyama et al. |
| 2003/0224284 | A1 | 12/2003 | Tao |
| 2004/0260031 | A1 | 12/2004 | Takeda et al. |
| 2006/0147836 | A1 | 7/2006 | Hatakeyama et al. |
| 2006/0228648 | A1* | 10/2006 | Ohsawa et al. ............ 430/270.1 |
| 2007/0003871 | A1 | 1/2007 | Kodama et al. |
| 2007/0149702 | A1 | 6/2007 | Ando et al. |
| 2007/0207408 | A1 | 9/2007 | Hatakeyama et al. |
| 2007/0218401 | A1 | 9/2007 | Ando et al. |
| 2007/0231738 | A1 | 10/2007 | Kaneko et al. |
| 2010/0075256 | A1* | 3/2010 | Joo et al. ................... 430/286.1 |

FOREIGN PATENT DOCUMENTS

| CA | 2049772 A1 | 2/1992 |
| JP | 4-230645 A | 8/1992 |
| JP | 11-282168 A | 10/1999 |
| JP | 2000-122296 A | 4/2000 |
| JP | 2002-214774 A | 7/2002 |
| JP | 2003-066612 A | 3/2003 |
| JP | 2003-140332 A | 5/2003 |
| JP | 2004-002252 A | 1/2004 |
| JP | 2004-115630 A | 4/2004 |
| JP | 2004-531749 A | 10/2004 |
| JP | 3613491 B2 | 11/2004 |
| JP | 2005-008766 A | 1/2005 |
| JP | 2005-084365 A | 3/2005 |
| JP | 2005-266766 A | 9/2005 |
| JP | 2006-178317 A | 7/2006 |
| JP | 2007-197718 A | 8/2007 |
| JP | 2007-297590 A | 11/2007 |
| WO | WO-2006/121096 A1 | 11/2006 |

OTHER PUBLICATIONS

Derwent English abstract for JP2006-178317.*
Machine-assisted English translation of JP2006-178317, as provided by JPO.*
Dammel, et al., "193 nm Immersion Lithography—Taking the Plunge", Journal of Photopolymer Science and Technology, vol. 17, No. 4 (2004), pp. 587-601.
Armitsu, et al., "Sensitivity Enhancement of Chemical-Amplification-Type Photoimaging Materials by Acetoacetic Acid Derivatives" Journal of Photopolymer Science and Technology, vol. 8, No. 1 (1995), pp. 43-44.
Kudo, et al., "Enhancement of the Sensitivity of Chemical-Amplification-Type Photoimaging Materials by β-Tosyloxyketone Acetals" Journal of Photopolymer Science and Technology, vol. 8, No. 1 (1995), pp. 45-46.
Arimitsu, et al., "Effect of Phenolic Hydroxyl Residues on the Improvement of Acid-Proliferation-Type Photoimaging Materials", Journal of Pholopolymer Science and Technology, vol. 9, No. 1 (1996), pp. 29-30.

* cited by examiner

*Primary Examiner* — Sin J. Lee

(74) *Attorney, Agent, or Firm* — Birch, Stewart, Kolasch & Birch, LLP

(57) ABSTRACT

A positive resist composition comprises a polymer comprising recurring units having a sulfonium salt incorporated therein as a base resin which becomes soluble in alkaline developer under the action of acid. The polymer generates a strong sulfonic acid upon exposure to high-energy radiation so as to facilitate effective scission of acid labile groups in the resist composition.

7 Claims, 2 Drawing Sheets

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2008-031322 filed in Japan on Feb. 13, 2008, the entire contents of which are hereby incorporated by reference.

TECHNICAL FIELD

This invention relates to (1) a positive resist composition comprising a polymer comprising recurring units containing a sulfonium salt, and (2) a patterning process using the resist composition.

BACKGROUND ART

While a number of recent efforts are being made to achieve a finer pattern rule in the drive for higher integration and operating speeds in LSI devices, DUV and VUV lithography is thought to hold particular promise as the next generation in microfabrication technology. In particular, photolithography using an ArF excimer laser as the light source is thought requisite to the micropatterning technique capable of achieving a feature size of 0.13 µm or less.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. See Journal of Photopolymer Science and Technology, Vol. 17, No. 4, p 587 (2004).

In the photolithography using an ArF excimer laser (wavelength 193 nm) as the light source, a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polyacrylic acid and derivatives thereof, norbornene-maleic anhydride alternating copolymers, polynorbornene, ring-opening metathesis polymers, and hydrogenated ring-opening metathesis polymers have been proposed as the base resin. This choice is effective to some extent in that the transparency of a resin alone is increased.

Studies have also been made on photoacid generators. In prior art chemically amplified resist compositions for lithography using KrF excimer laser, photoacid generators capable of generating alkane- or arene-sulfonic acids are used. However, the use of these photoacid generators in chemically amplified resist compositions for ArF lithography results in an insufficient acid strength to scissor acid labile groups on the resin, a failure of resolution or a low sensitivity. Thus these photoacid generators are not suited for the fabrication of microelectronic devices.

For the above reason, photoacid generators capable of generating perfluoroalkanesulfonic acids having a high acid strength are generally used in ArF chemically amplified resist compositions. These photoacid generators capable of generating perfluoroalkanesulfonic acids have already been developed for use in the KrF resist compositions. For instance, JP-A 2000-122296 and U.S. Pat. No. 6,048,672 (or JP-A 11-282168) describe photoacid generators capable of generating perfluorohexanesulfonic acid, perfluorooctanesulfonic acid, perfluoro-4-ethylcyclohexane-sulfonic acid, and perfluorobutanesulfonic acid. JP-A 2002-214774, US Patent Application Publication 2003-0113659 A1 (JP-A 2003-140332), and US Patent Application Publication 2002-0197558 A1 describe novel photoacid generators capable of generating perfluoroalkyl ether sulfonic acids.

Among these, perfluorooctanesulfonic acid derivatives (collectively referred to as PFOS) are considered problematic with respect to their non-degradability and biological concentration in the environment. Manufacturers made efforts to develop partially fluorinated alkane sulfonic acids having a reduced degree of fluorine substitution as the replacement to PFOS. For instance, JP-A 2004-531749 describes the development of α,α-difluoroalkanesulfonic acid salts from α,α-difluoroalkene and a sulfur compound and discloses a resist composition comprising a photoacid generator which generates such sulfonic acid upon exposure, specifically di(4-tert-butylphenyl)iodonium 1,1-difluoro-2-(1-naphthyl)-ethanesulfonate. JP-A 2004-2252 describes the development of α,α,β,β-tetrafluoroalkanesulfonic acid salts from α,α,β,β-tetrafluoro-α-iodoalkane and sulfur compound and discloses a photoacid generator capable of generating such a sulfonic acid and a resist composition comprising the same. JP-A 2002-214774 discloses such photoacid generators having difluorosulfoacetic acid alkyl esters and difluorosulfoacetic acid amides although their synthesis method is lacking. Furthermore, JP-A 2005-266766 discloses a photosensitive composition comprising a compound capable of generating a partially fluorinated alkane sulfonic acid having a sulfonylamide structure derived from perfluoroalkylene disulfonyl difluoride.

However, even when these acid generators are used, the line edge roughness (LER) of a resist pattern is still a problem. It is pointed out that with a progress of miniaturization, the edge roughness of a photoresist after development is reflected by the edge roughness after etching, which is detrimental to device characteristics. In order to reduce the edge roughness of resist, many improvements have been proposed on the polymer side including optimization of polymer molecular weight, narrow dispersity polymers, living anion polymerization or living radical polymerization for the polymerization of such polymers, a dropwise polymerization technique for attaining a uniform polymerization rate, a uniform polymerization rate achieved by converting a lactone monomer having a high polymerization rate into an acrylic one having a somewhat lower polymerization rate, and prevention of swelling during development by introducing recurring units having a hexafluoroalcohol group as the adhesive group. Another effective means for reducing the resist edge roughness is by increasing the amounts of an acid generator and a quencher (or basic compound) to enhance the contrast. The increased amount of acid generator, however, reduces transparency so that the resist profile is tapered or increases the acid diffusion distance to give rise to problems such as a loss of exposure margin and an increased mask error factor (MEEF).

Under the circumstances, it was proposed to form a polymer from an acryloyloxyphenyl diphenyl sulfonium salt as a monomer for enhancing sensitivity (as described in JP-A 4-230645) and to incorporate the monomer into a polyhydroxystyrene resin for improving the line edge roughness of this base resin (as described in JP-A 2005-84365). However, since the sulfonium salt is bonded at its cation side to the polymer, the sulfonic acid generated thereby upon exposure to high-energy radiation is not different from the sulfonic acids generated by conventional photoacid generators, which is unsatisfactory in view of the outstanding problem. Also, sulfonium salts having an anion side incorporated into the polymer backbone such as polystyrenesulfonic acid are disclosed as effective in enhancing sensitivity or improving resist pattern profile (Japanese Patent No. 3,613,491). The acids generated thereby are arenesulfonic and alkylsulfonic acid derivatives which have too low an acid strength to sever acid labile groups, especially acid labile groups in ArF chemically amplified resist compositions. JP-A 2006-178317 discloses a resist material comprising a polymer having a multiplicity of partially fluorinated sulfonic acid anions as polymerizable units. WO 2006-121096 A1 discloses a polymer having three partially fluorinated sulfonic acid anions in combination with a specific lactone compound. JP-A 2007-197718 discloses three anions. The polymers of WO 2006-121096 and JP-A 2007-197718 are still unsatisfactory because the former polymer exhibits a high acid diffusion due to a linker interposed, and the latter polymer in the form of difluoroacetate is susceptible to hydrolysis (storage instability).

With respect to the immersion lithography, some problems arise from minute water droplets which are left on the resist and wafer after the immersion exposure. They can often cause damages and defects to the resist pattern profile. The resist pattern after development can collapse or deform into a T-top profile. There exists a need for a patterning process which can form a satisfactory resist pattern after development according to the immersion lithography.

The lithography techniques which are considered promising next to the ArF lithography include electron beam (EB) lithography, $F_2$ lithography, extreme ultraviolet (EUV) lithography, and x-ray lithography. In these techniques, exposure must be done in vacuum or reduced pressure, which allows the sulfonic acid generated during exposure to volatilize, failing to form a satisfactory pattern profile. The sulfonic acid volatilized can damage the exposure system.

DISCLOSURE OF THE INVENTION

An object of the present invention is to provide (1) a positive resist composition comprising as a base resin a polymer comprising recurring units having a sulfonium salt useful as a monomer, which composition exhibits a high resolution and improved line edge roughness (LER) when processed by the photolithography using high-energy radiation, typically ArF excimer laser radiation as the light source, and (2) a patterning process using the resist composition.

The inventors have found that a resist composition comprising as a base resin a polymer comprising recurring units having a sulfonium salt of the general formula (b) incorporated therein exhibits good characteristics including exposure dose dependency, pattern density dependency, and line edge roughness (LER); and that the polymer is very effective as a resist material in precise micropatterning.

Thus the invention provides a resist composition and a patterning process, as defined below.

In a first aspect, the invention provides a positive resist composition comprising as a base resin (A) a polymer comprising recurring units having the general formulae (a), (b), (c), and (d).

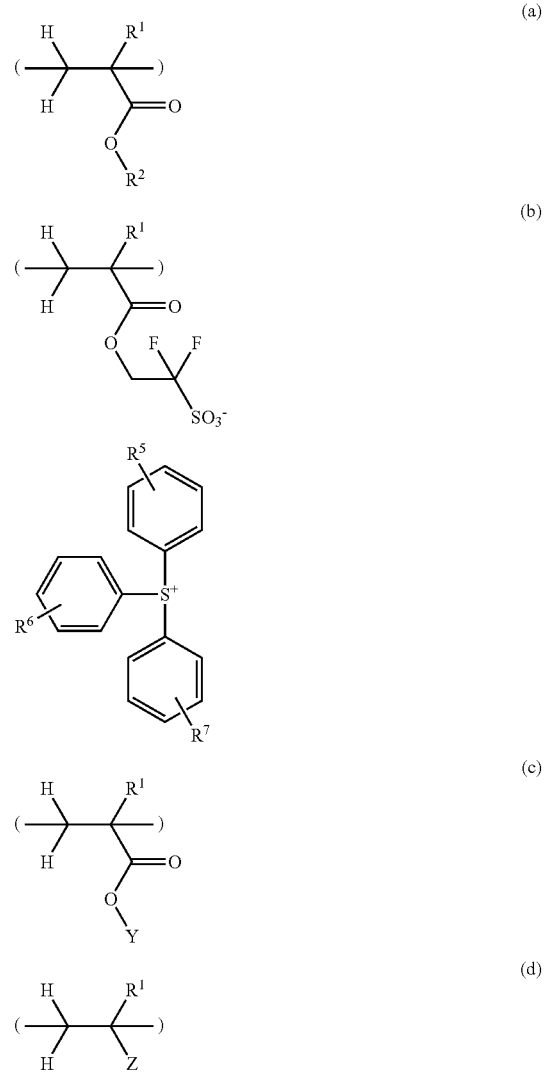

Herein $R^1$ is each independently hydrogen or methyl, $R^2$ is an acid labile group, Y is a lactone structure-containing substituent group, Z is a hydroxyl-containing organic group, $R^5$, $R^6$, and $R^7$ are each independently hydrogen or a straight, branched or cyclic monovalent hydrocarbon group of 1 to 20 carbon atoms which may contain a heteroatom.

Preferably, in units (c) in polymer (A), the lactone structure-containing substituent group represented by Y is one or multiple groups selected from the following formulae (c-1) through (c-6).

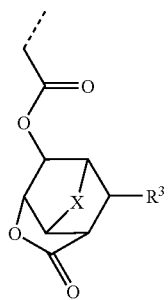 (c-2)

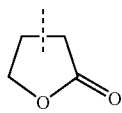 (c-3)

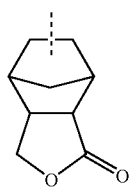 (c-4)

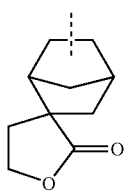 (c-5)

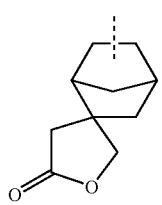 (c-6)

Herein the broken line denotes a valence bond, X is O or $CH_2$, $R^3$ is $CO_2R^4$ when X is $CH_2$, $R^3$ is hydrogen or $CO_2R^4$ when X is O, and $R^4$ is a straight, branched or cyclic monovalent hydrocarbon group of 1 to 20 carbon atoms which may contain a heteroatom.

Preferably, in units (a) in polymer (A), the acid labile group represented by $R^2$ is one or multiple groups selected from the following formulae (a-1) through (a-8).

 (a-1)

 (a-2)

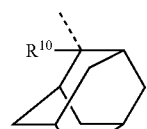 (a-3)

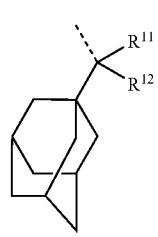 (a-4)

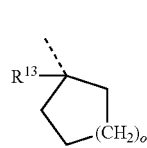 (a-5)

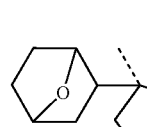 (a-6)

 (a-7)

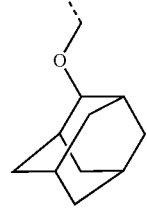 (a-8)

Herein the broken line denotes a valence bond, $R^9$, $R^{10}$, $R^{11}$, and $R^{12}$ are each independently a straight or branched $C_1$-$C_4$ alkyl group, $R^{13}$ is a straight or branched $C_1$-$C_4$ alkyl, cyclopentyl or cyclohexyl, "o" is 1 or 2, and p is 1 or 2.

Preferably, in units (d) in polymer (A), the hydroxyl-containing organic group represented by Z is one or multiple groups selected from the following formulae (d-1) through (d-5).

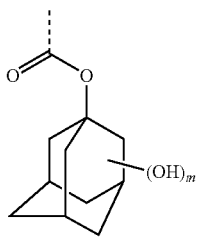
(d-1)

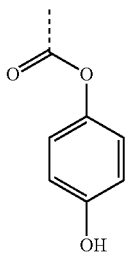
(d-2)

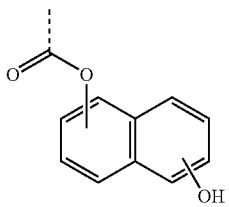
(d-3)

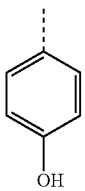
(d-4)

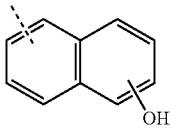
(d-5)

Herein the broken line denotes a valence bond, and m is 1 or 2.

In a preferred embodiment, the recurring units (d) having a group of formula (d-4) or (d-5) are derived by polymerizing a starting compound having a group of formula (M-d-4) or (M-d-5), followed by partial acid hydrolysis to form a hydroxyl-containing organic group of formula (d-4) or (d-5).

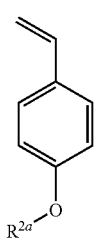
(M-d-4)

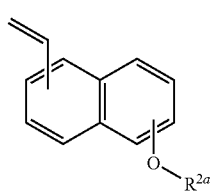
(M-d-5)

Herein $R^{2a}$ is 1-alkoxyalkyl of total 2 to 8 carbon atoms, tetrahydropyranyl or tetrahydrofuranyl.

The resist composition may further comprise as component (B) an acid generator having the general formula (1):

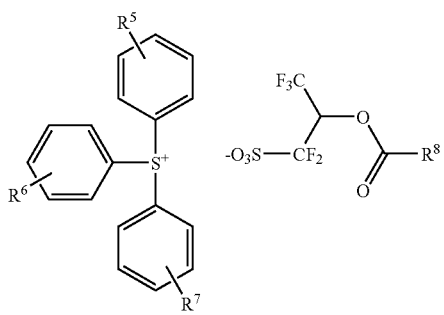
(1)

wherein $R^5$, $R^6$, and $R^7$ are each independently hydrogen or a straight, branched or cyclic monovalent hydrocarbon group of 1 to 20 carbon atoms which may contain a heteroatom, and $R^8$ is a straight, branched or cyclic monovalent hydrocarbon group of 7 to 30 carbon atoms which may contain a heteroatom; and a surfactant which is insoluble in water and soluble in an alkaline developer.

In a second aspect, the invention provides a pattern forming process comprising the steps of applying the positive resist composition defined above onto a substrate to form a coating, heat treating the coating and exposing it to high-energy radiation through a photomask, and optionally heat treating the exposed coating and developing it with a developer;

a pattern forming process comprising the steps of applying the positive resist composition defined above onto a substrate to form a resist coating, heat treating the resist coating, applying onto the resist coating a protective coating which is insoluble in water and soluble in an alkaline developer, exposing the coated substrate to high-energy radiation from a projection lens through a photomask while holding water between the substrate and the projection lens, optionally heat treating, and developing with a developer; and a pattern forming process comprising the steps of applying the positive resist composition defined above onto a substrate to form a coating, heat treating the coating, imagewise writing with an electron beam, optionally heat treating the coating, and developing it with a developer.

It is noted that the resist composition of the invention can be applied to the immersion lithography. The immersion lithography involves prebaking a resist film and exposing the resist film to light through a projection lens with a liquid medium interposed between the resist film and the projection lens. The ArF immersion lithography generally uses deionized water as the immersion medium. This technology, combined with a projection lens having a numerical aperture of at least 1.0, is important for the ArF lithography to survive to the 65 nm node and forth, with a further development thereof being accelerated.

The resist composition of the invention allows the feature size of the pattern after development to be reduced by various shrinkage techniques. For example, the hole size can be shrunk by such known techniques as thermal flow, RELACS, SAFIRE, and WASOOM. More effective shrinkage of hole size by thermal flow is possible particularly when the inventive polymer is blended with a hydrogenated cycloolefin ring-opening metathesis polymer (ROMP) having a low Tg.

BENEFITS OF THE INVENTION

The positive resist composition of the invention has many advantages. Since the base resin in the resist composition comprises recurring units having incorporated therein a sulfonium salt which has fluorine atoms at α-position relative to sulfonic acid, it generates a very strong sulfonic acid upon exposure to high-energy radiation so that it facilitates effective scission of acid labile groups in chemically amplified resist compositions. A radiation-sensitive resist composition comprising the polymer of the invention as a base resin exhibits a high resolution and is improved in pattern density dependency and exposure margin when processed by photolithography. The polymer is advantageously used to formulate a resist composition adapted for precise micropatterning. In the practice of ArF immersion lithography, the polymer prevents leach-out in water and also minimizes the influence of water left on the wafer, restraining defect formation. In the disposal of resist-containing waste liquid after the device fabrication, (meth)acrylic ester moieties are hydrolyzable under basic conditions so that the polymers can be converted into less accumulative compounds of lower molecular weight. In the case of disposal by combustion, the polymers are more combustible because of a low degree of fluorine substitution.

DESCRIPTION OF THE PREFERRED EMBODIMENT

Figure 1:
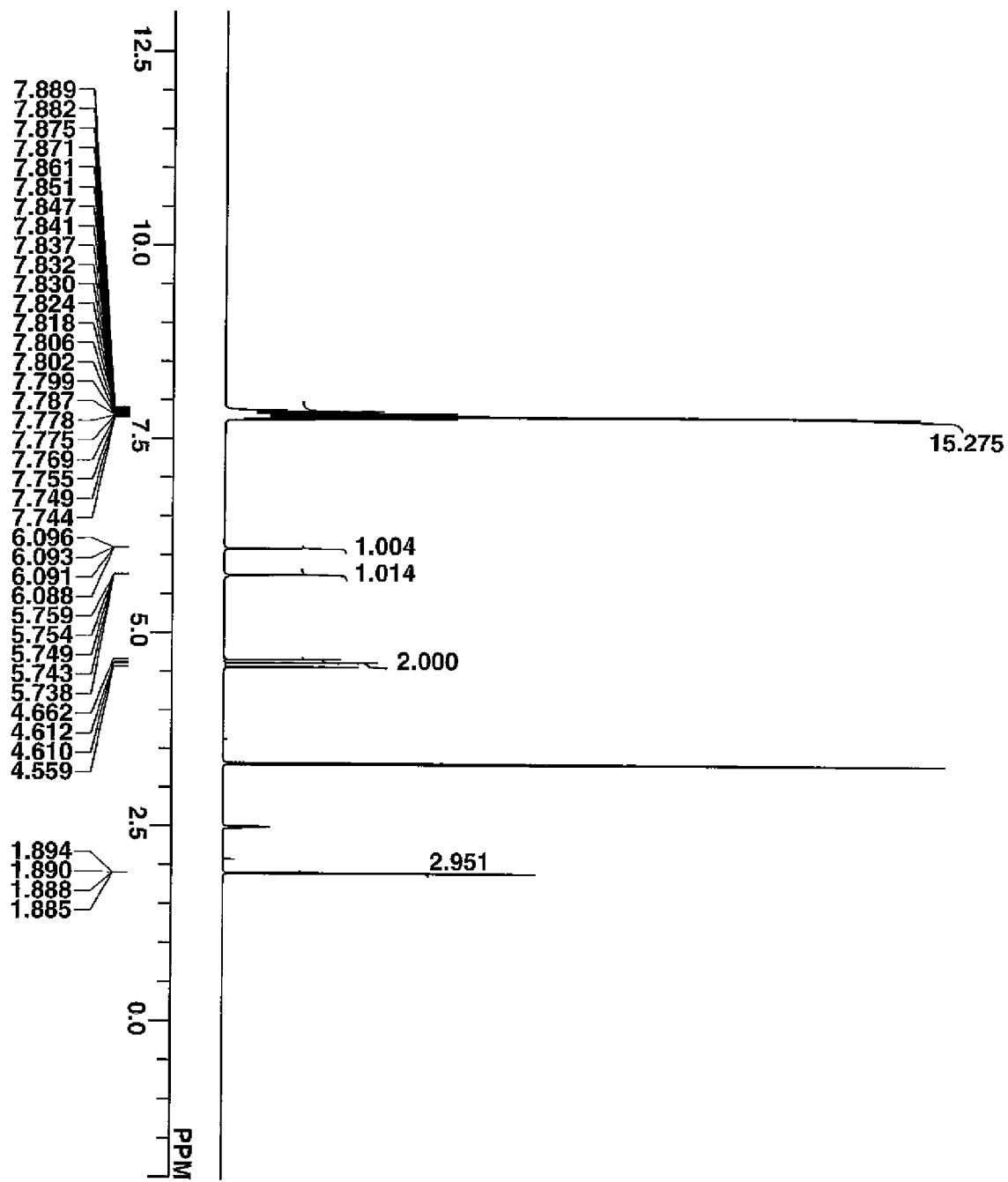
FIG. 1 is a diagram showing the $^1$H-NMR spectrum of MPAG-1 synthesized in Reference Example.

As used herein, the singular forms "a," "an" and "the" include plural referents unless the context clearly dictates otherwise.

The notation (Cn-Cm) means a group containing from n to m carbon atoms per group.

The term "high-energy radiation" is intended to encompass ultraviolet (UV) radiation, deep UV, electron beam (EB), EUV, x-ray, excimer laser, γ-ray and synchrotron radiation.

Polymer

In the positive resist composition of the invention, (A) a polymer or high molecular weight compound is used as a base resin. The polymer is characterized by comprising recurring units having the following general formulae (a), (b), (c), and (d).

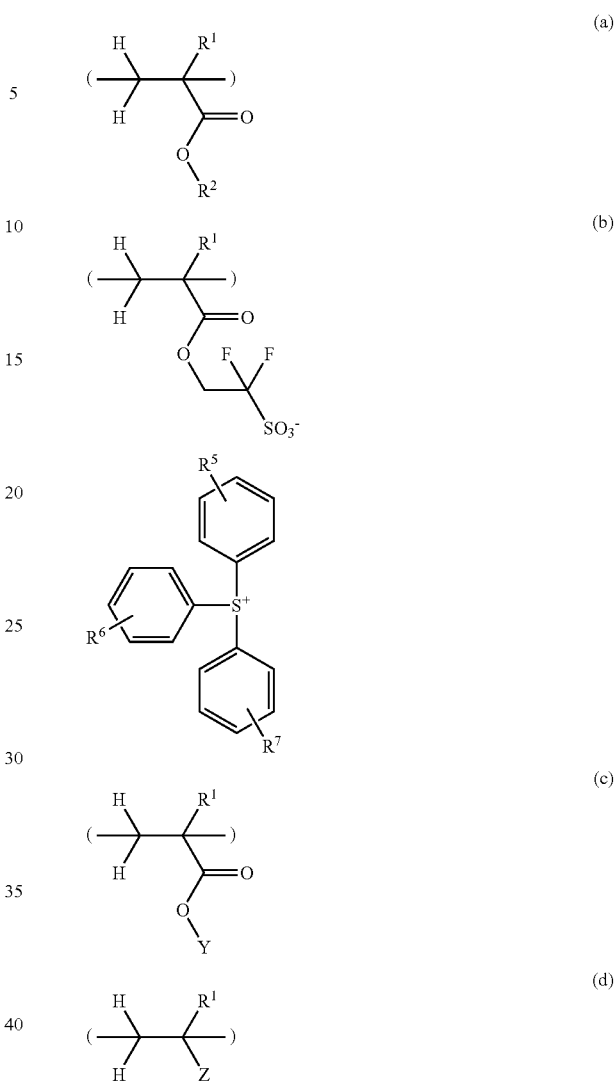

Herein $R^1$ is each independently hydrogen or methyl. $R^2$ is an acid labile group, Y is a lactone structure-containing substituent group, and Z is a hydroxyl-containing organic group, which will be illustrated below in detail.

$R^5$, $R^6$, and $R^7$ are each independently hydrogen or a straight, branched or cyclic monovalent hydrocarbon group of 1 to 20 carbon atoms which may contain a heteroatom. Suitable hydrocarbon groups include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero atomic group such as —O—, —S—, —SO—, —SO$_2$—, —NH—, —C(=O)—, —C(=O)O— or —C(=O)NH— or in which any hydrogen atom is substituted by a functional group such as —OH, —NH$_2$, —CHO, or —CO$_2$H.

In units (a) in polymer (A), the acid labile group represented by $R^2$ is preferably one or multiple groups selected from the following formulae (a-1) through (a-8).

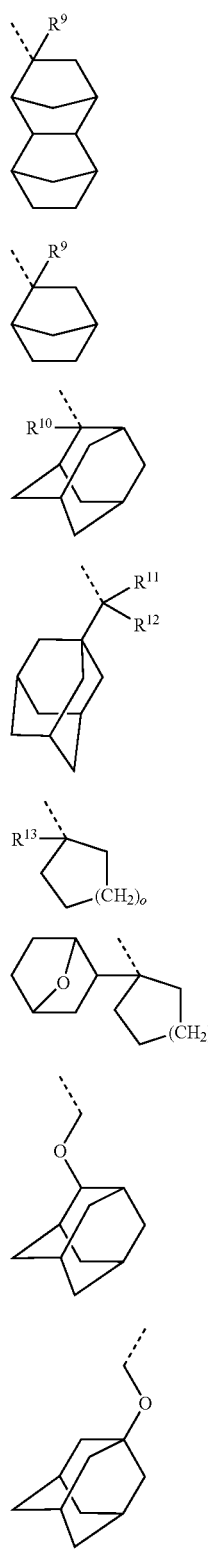

(a-1)

(a-2)

(a-3)

(a-4)

(a-5)

(a-6)

(a-7)

(a-8)

Herein the broken line denotes a valence bond. $R^9$, $R^{10}$, $R^{11}$, and $R^{12}$ are each independently a straight or branched $C_1$-$C_4$ alkyl group, such as methyl, ethyl, propyl, isopropyl, n-butyl, sec-butyl and tert-butyl. $R^{13}$ is a straight or branched $C_1$-$C_4$ alkyl, cyclopentyl or cyclohexyl, such as methyl, ethyl, propyl, isopropyl, n-butyl, sec-butyl, tert-butyl, cyclopentyl or cyclohexyl. The subscript "o" is equal to 1 or 2, and p is equal to 1 or 2.

For formula (a-1), there can exist enantiomers and diastereomers. Formula (a-1) collectively represents all such stereoisomers. Such stereoisomers may be used alone or in admixture.

Examples of the acid labile group represented by $R^2$ are given below, but not limited thereto.

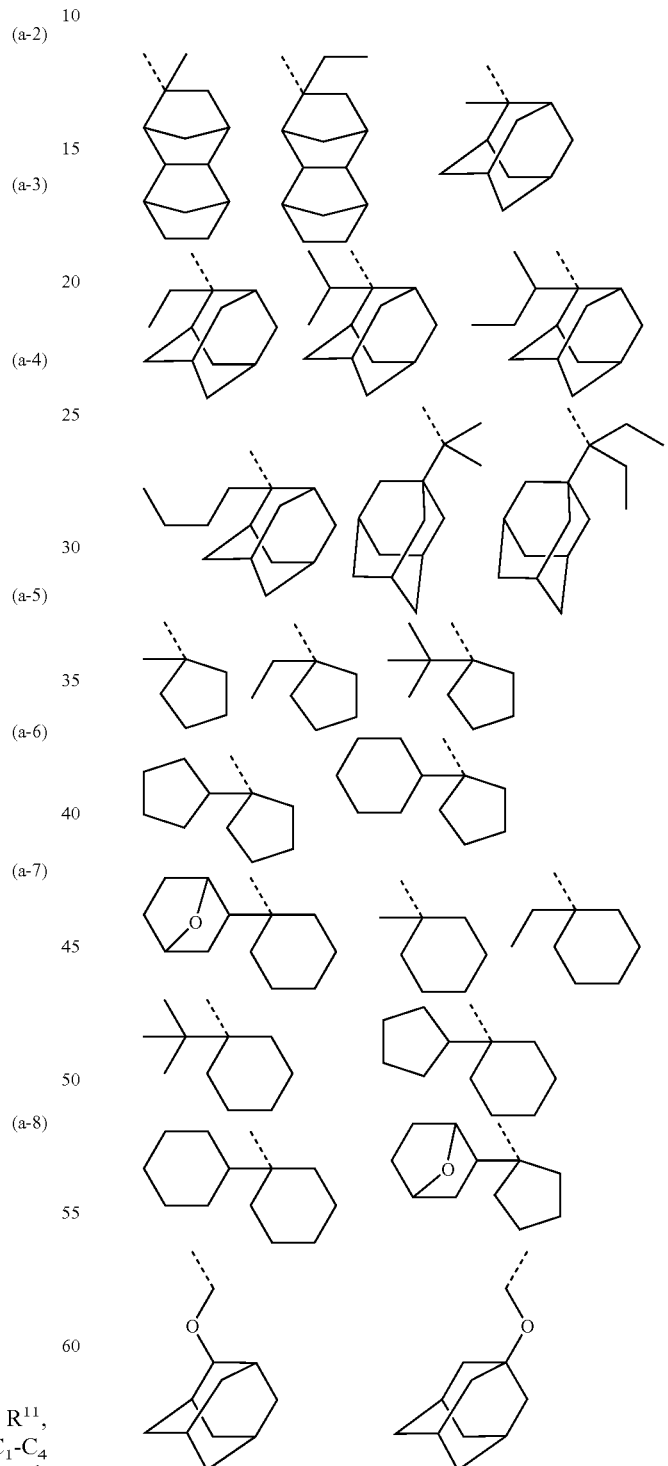

Note that the broken line denotes a valence bond.

The preferred acid labile groups are of the following formulae.
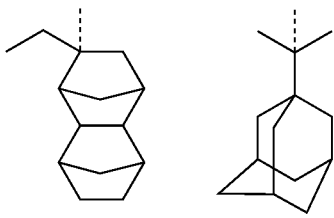
Note that the broken line denotes a valence bond. Understandably, the left formula collectively represents enantiomers and diastereomers.
Illustrative, non-limiting examples of suitable reactants from which recurring units (b) in polymer (A) are derived are given below.
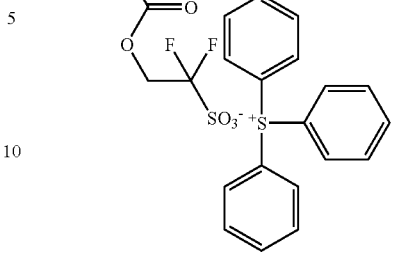
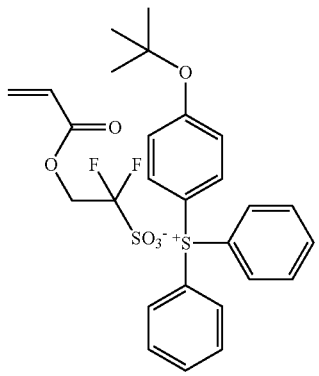
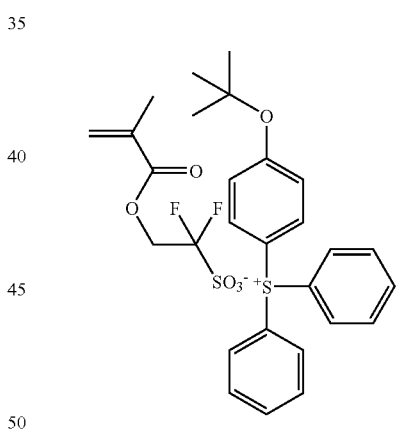
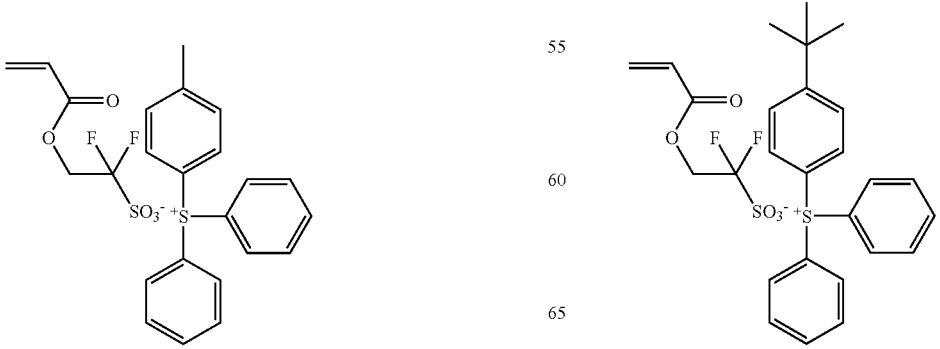

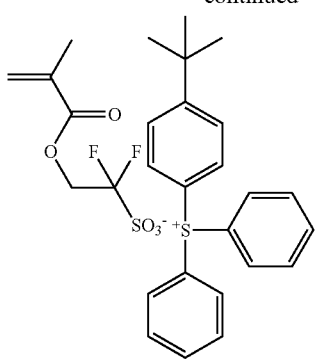

These reactants from which recurring units (b) capable of generating an acid in response to actinic light or radiation are derived can be synthesized by the following process, for example.

One exemplary compound may be synthesized by reacting 2-bromo-2,2-difluoroethanol with pivalic chloride or anhydride to form 2-bromo-2,2-difluoroethyl pivalate, converting the bromo group into sodium sulfinate using a sulfur compound such as sodium dithionite, and converting sulfinic acid into sulfonic acid using an oxidizing agent such as hydrogen peroxide. This is followed by cation exchange with a triarylsulfonium halide or the like. The pivalic ester is then subjected to alkaline hydrolysis. Through reaction with (meth)acrylic anhydride, the alcohol resulting from hydrolysis is converted into a (meth)acrylic derivative, yielding the end compound.

The steps of esterification, conversion from alkane halide to sodium sulfinate, and conversion to sulfonic acid are well known, while the formulations used in the latter two steps are described in JP-A 2004-2252. The outline of the process is illustrated below.

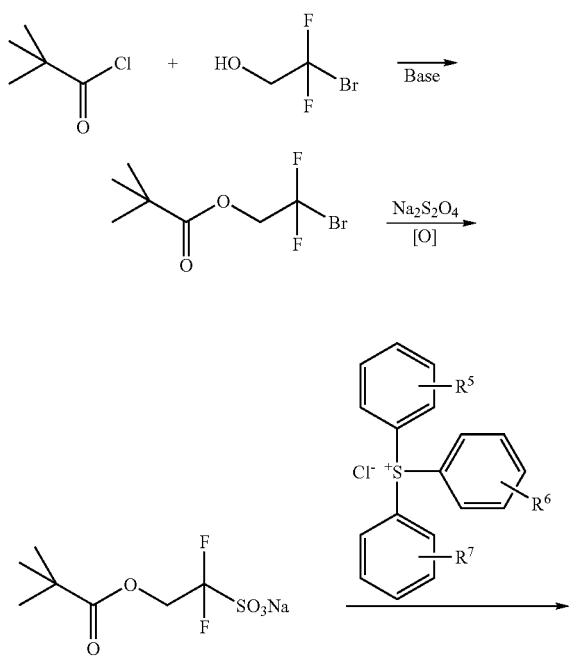

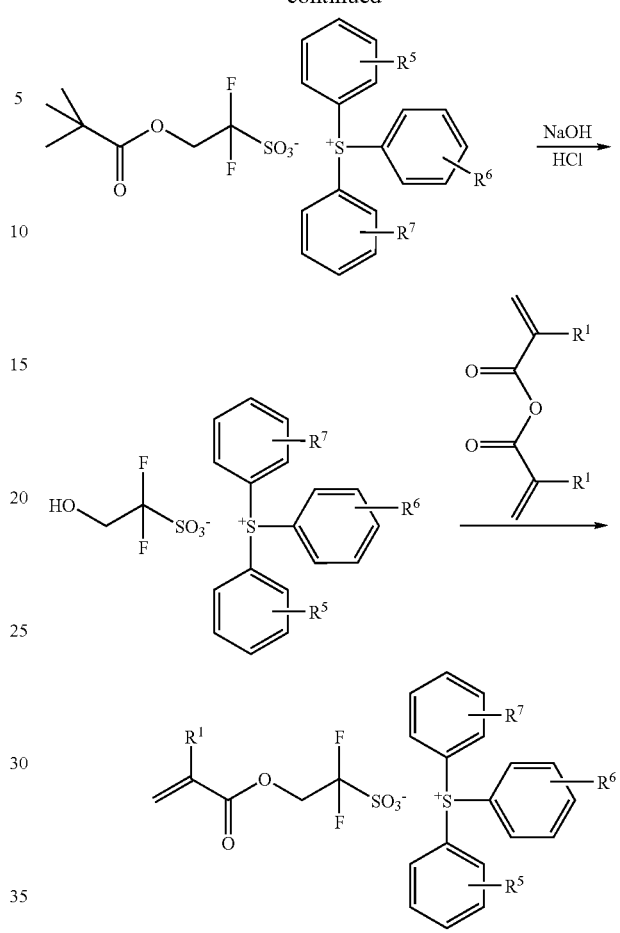

Note that $R^1$, $R^5$, $R^6$ and $R^7$ are as defined above.

In recurring units (c) in polymer (A), examples of the lactone structure-containing substituent group represented by Y include the following formulae (c-1) through (c-6), but are not limited thereto.

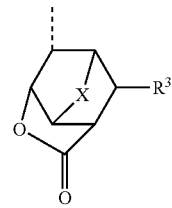
(c-1)

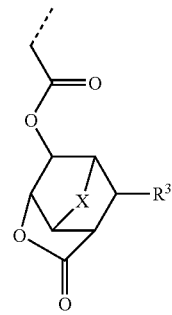
(c-2)

(c-3)
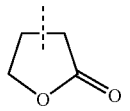

(c-4)
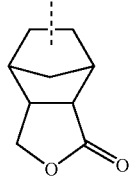

(c-5)
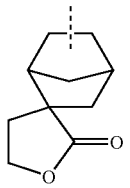

(c-6)
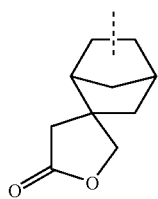

Herein the broken line denotes a valence bond. X is O or $CH_2$. $R^3$ is $CO_2R^4$ when X is $CH_2$, and $R^3$ is hydrogen or $CO_2R^4$ when X is O. $R^4$ is a straight, branched or cyclic monovalent hydrocarbon group of 1 to 20 carbon atoms which may contain a heteroatom.

Preferred lactone structure-containing substituent groups have the following formulae.

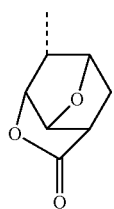 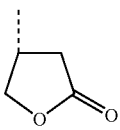 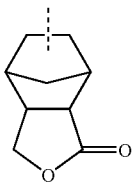

Note that the broken line denotes a valence bond.

In recurring units (d) in polymer (A), examples of the hydroxyl-containing organic group represented by Z include the following formulae (d-1) through (d-5), but are not limited thereto.

(d-1)
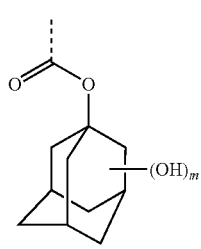

(d-2)
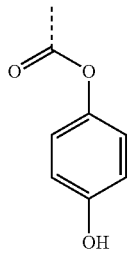

(d-3)
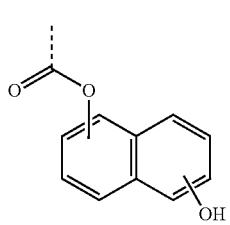

(d-4)
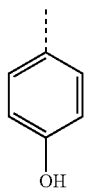

(d-5)
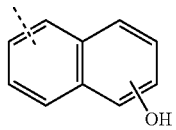

Herein the broken line denotes a valence bond, and m is 1 or 2.

Preferred hydroxyl-containing organic groups have the following formulae.

(d-1')
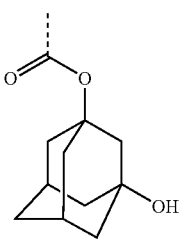

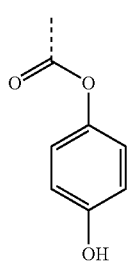
(d-2)

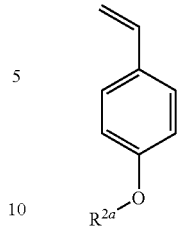
(M-d-4)

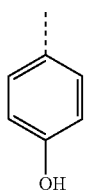
(d-4)

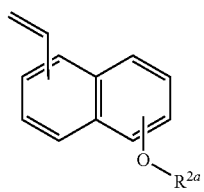
(M-d-5)

Note that the broken line denotes a valence bond.

A polymer having a group of formula (d-4) or (d-5) may be prepared by using a compound of the following formula (M-d-4) or (M-d-5) as one of starting monomers and effecting polymerization and partial hydrolysis.

Herein $R^{2a}$ is a 1-alkoxyalkyl group having total 2 to 8 carbon atoms, tetrahydropyranyl or tetrahydrofuranyl.

One exemplary reaction scheme involved in the process of producing a polymer (A) using a reactant of formula (M-d-4) is illustrated below.

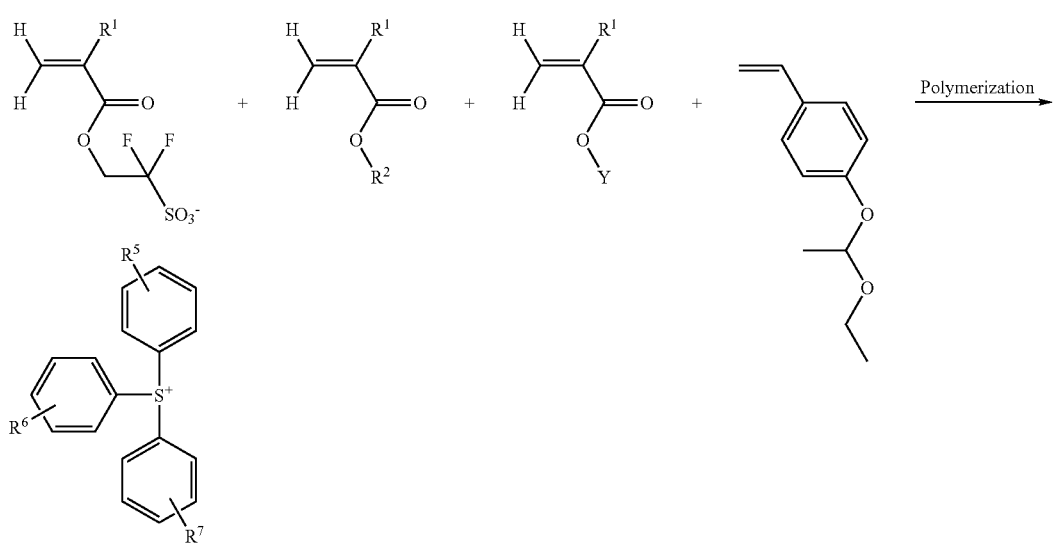

[19]

-continued

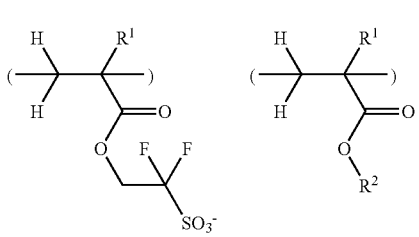
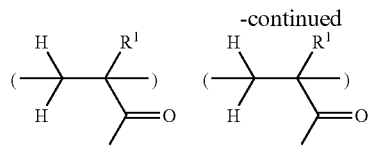
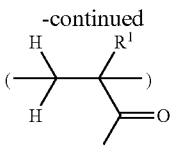
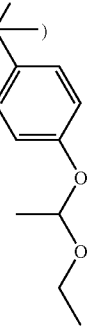
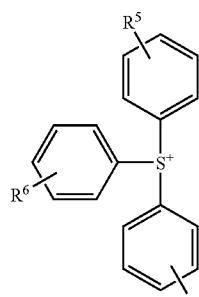
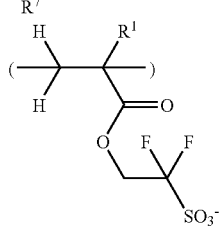

Herein $R^1$, $R^2$, $R^5$, $R^6$, $R^7$ and Y are as defined above.

While the polymer as resin component (A) contains recurring units (a), (b), (c), and (d) as essential units, it may further contain additional units (e), for example, recurring units of one or more type having acenaphthylene, indene, norbornadiene, norbornene, vinyl ether, maleic anhydride, maleimide, methacrylic acid, acrylic acid or the like. The additional units are not limited to these examples.

The proportion of recurring units (a), (b), (c) and (d) and optional recurring units (e) relative to the entire recurring units within the polymer as resin component (A) is desirably in the following range (molar ratio):

$a/[a+b+c+d+e]$=0.05 to 0.3, $b/[a+b+c+d+e]$=0.05 to 0.4, $c/[a+b+c+d+e]$=0.1 to 0.5, $d/[a+b+c+d+e]$=0.05 to 0.3, and $e/[a+b+c+d+e]$=0 to 0.2, provided that the total of recurring units (a) to (e) is 100 mol % relative to the total of entire recurring units.

The polymer defined herein is applicable to not only the ArF lithography, but also another lithography such as KrF, EB or EUV lithography.

It is noted that the polymer has a weight average molecular weight (Mw) of 1,000 to 500,000, and preferably 3,000 to 100,000. Outside the range, a polymer may suffer an extreme drop of etching resistance or a reduced resolution due to a failure to provide a difference in dissolution rate before and after exposure. The measurement of molecular weight may be performed by gel permeation chromatography (GPC) versus polystyrene standards or a light scattering method.

The polymer may be prepared through copolymerization reaction using the compound illustrated for resin component (A) as a first monomer and other compounds having a polymerizable double bond as second and subsequent monomers. Various modes of copolymerization reaction may be used for the preparation of the polymer. The preferred modes are radical polymerization, anionic polymerization and coordination polymerization.

For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about ½ hour to about 48 hours. Reaction conditions outside the described range may be employed if desired.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyllithium and sec-butyllithium, ketyl, and Grignard reagents, (c) a temperature of about −78° C. to about 0° C., (d) a time of about ½ hour to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkylaluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about ½ hour to about 48 hours. Reaction conditions outside the described range may be employed if desired.

Once a polymer is prepared by the above polymerization process, its solubility in alkaline developer may be controlled through deprotection of some or all acid labile groups on the polymer. For example, once a polymer is formed through radical polymerization of 4-ethoxyethoxystyrene and a monomer from which a sulfonium salt of formula (b) is derived, the polymer may be converted into a copolymer with polyhydroxystyrene by eliminating ethoxyethoxy groups from the polymer using acetic acid, pyridinium tosylate or the like.

Resist Composition

The polymer defined above, referred to as "inventive polymer," is advantageously used as a base resin in a positive resist composition, and specifically a chemically amplified positive resist composition. Thus the invention provides a positive resist composition, and especially a chemically amplified positive resist composition comprising the inventive polymer as a base resin. The positive resist composition preferably comprises:

(A) a base resin comprising the inventive polymer,
(C) an organic solvent, and optionally,
(B) an acid generator,
(D) a quencher, and
(E) a surfactant.

For the positive resist composition, the base resin as component (A) may comprise another resin having a dissolution rate in an alkaline developer that increases under the action of an acid, if desired, as well as the inventive polymer. Exemplary other resins include, but are not limited to, (i) poly(meth)acrylic acid derivatives, (ii) norbornene derivative/maleic anhydride copolymers, (iii) hydrogenated products of ring-opening metathesis polymers (ROMP), (iv) vinyl ether/maleic anhydride/(meth)acrylic acid derivative copolymers, and (v) polyhydroxystyrene derivatives.

Of these, the poly(meth)acrylic acid derivatives (i) are polymers comprising units of formulae (a), (c) and (d) in combination. The polyhydroxystyrene derivatives (v) include polymers comprising units of the following formulae (e) to (h) in combination and polymers comprising units of formulae (a), (c) and (d) and units of formulae (e) to (h) in combination. In these polymers, a proportion of those units having acid labile groups, for example, monomer units of one or more types selected from among formulae (a) and (e) and a combination thereof is from more than 0 mole % to 80 mole %, preferably 1 to 50 mole %, and more preferably 10 to 40 mole %. The formulae (e) to (h) are shown below.

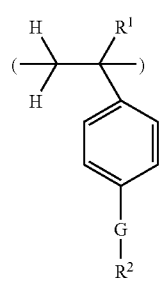

(e)

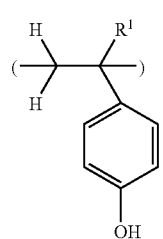

(f)

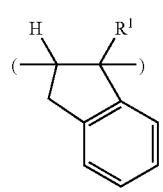

(g)

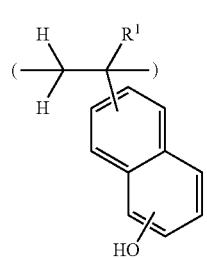

(h)

Herein $R^1$ and $R^2$ are as defined above, and G is oxygen or carbonyloxy (—C(═O)O—).

The hydrogenated products of ROMP (iii) are synthesized by the method illustrated in Examples of JP-A 2003-66612. Illustrative examples of such hydrogenated polymers include those polymers having the recurring units shown below, but are not limited thereto.

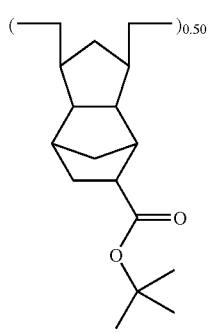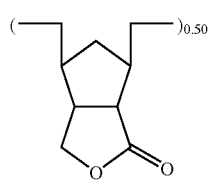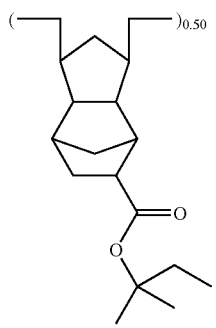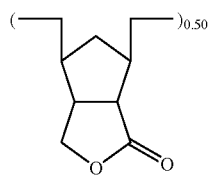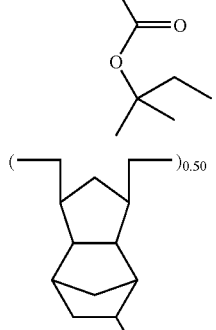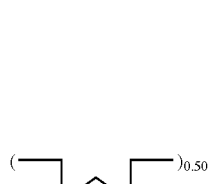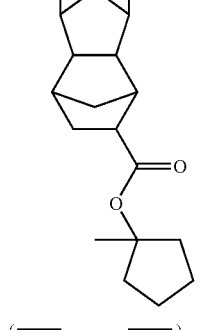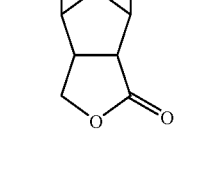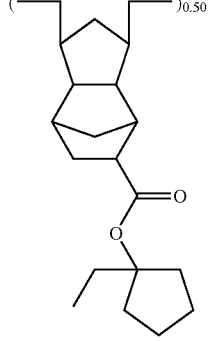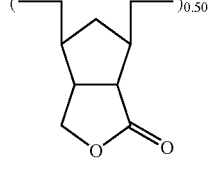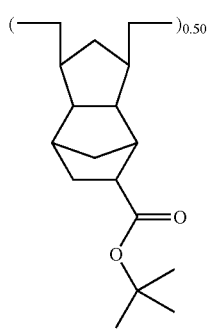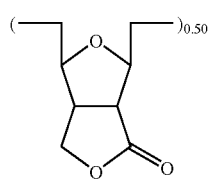
-continued
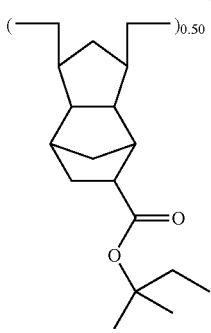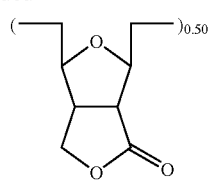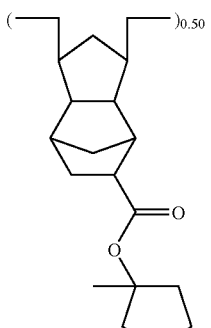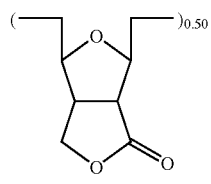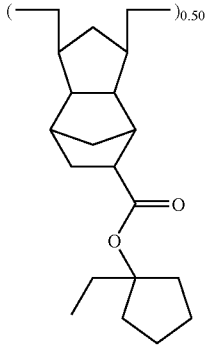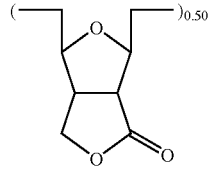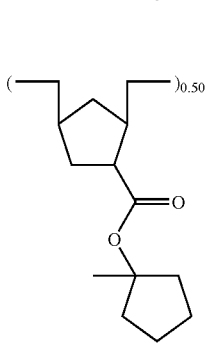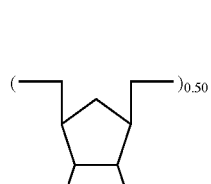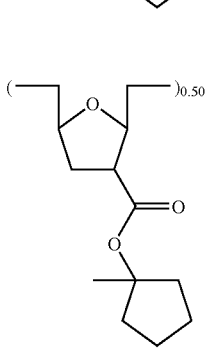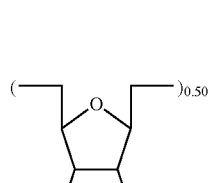

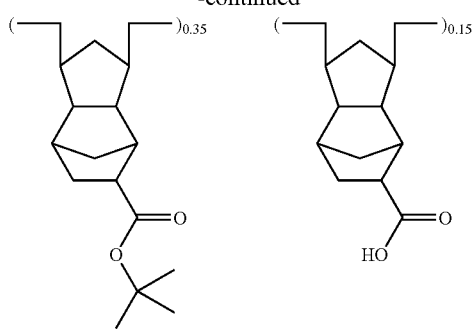
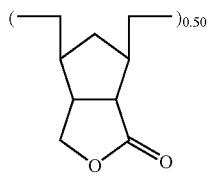
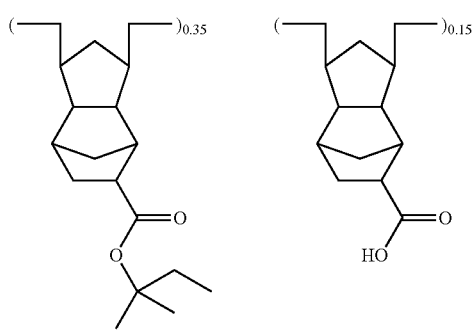
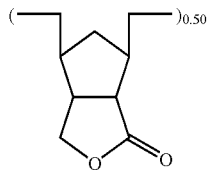
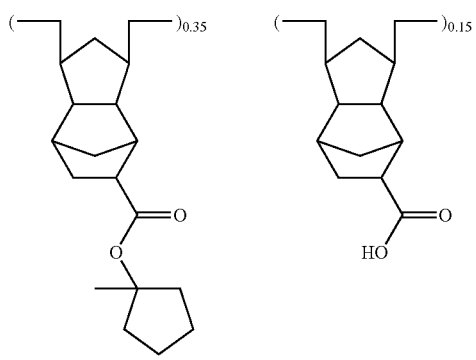
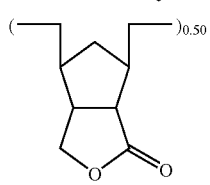
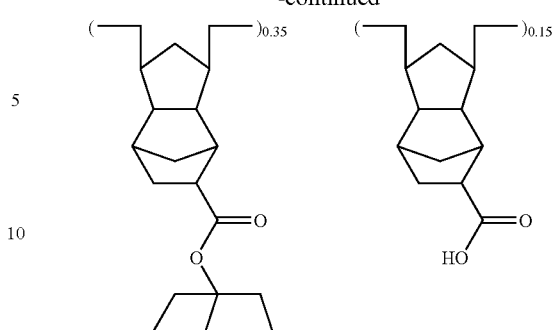
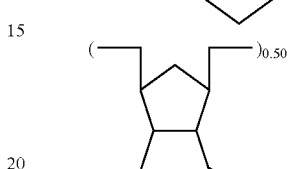
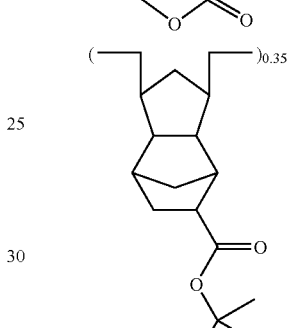
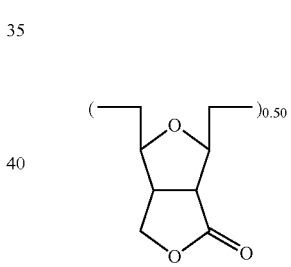
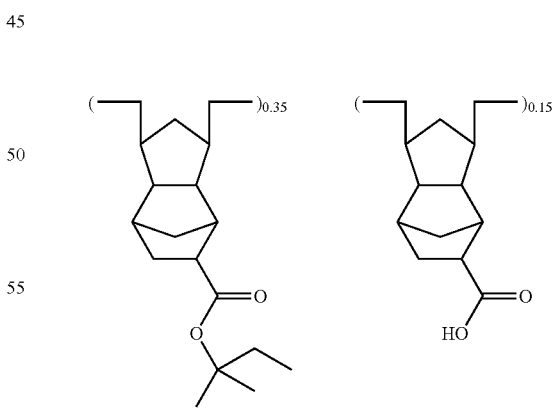
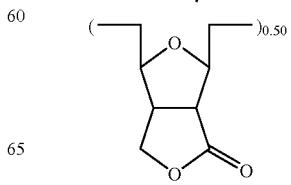

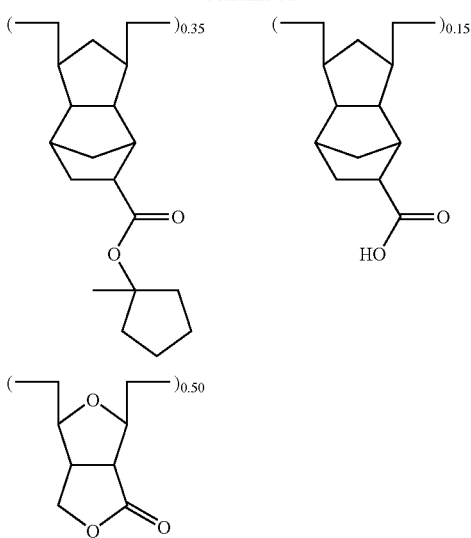
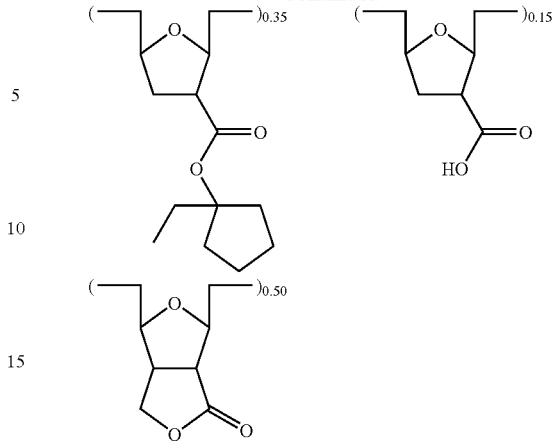

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer. The polymer is not limited to one type and a mixture of two or more polymers may be added. The use of plural polymers allows for easy adjustment of resist properties.

Photoacid Generator

In the practice of the invention, an acid generator is optionally used as component (B). Where a photoacid generator is added as the acid generator, it may be any compound capable of generating an acid upon exposure to high-energy radiation. Suitable photoacid generators include sulfonium salts, iodonium salts, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations include diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Iodonium salts based on combination of the foregoing examples are included.

N-sulfonyloxydicarboxyimide photoacid generators include combinations of imide skeletons with sulfonates. Exemplary imide skeletons are succinimide, naphthalenedicarboxyimide, phthalimide, cyclohexyldicarboxyimide, 5-norbornene-2,3-dicarboxyimide, and 7-oxabicyclo[2.2.1]-5-heptene-2,3-dicarboxyimide. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2- hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Also useful are O-arylsulfonyl oxime and O-alkylsulfonyl oxime (oxime sulfonate) photoacid generators. They include oxime sulfonate compounds having an electron-withdrawing group (e.g., trifluoromethyl) for increased stability, as represented by the formula (Ox-1):

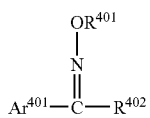
(Ox-1)

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is a substituted or unsubstituted aromatic or hetero-aromatic group.

Examples include 2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-(nonafluorobutylsulfonyloxyimino)hexyl]fluorene, 2-[2,2,3,3,4,4,5,5-octafluoro-1-(nonafluorobutylsulfonyloxyimino)pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Among others, acid generators having the general formula (1) are preferred.

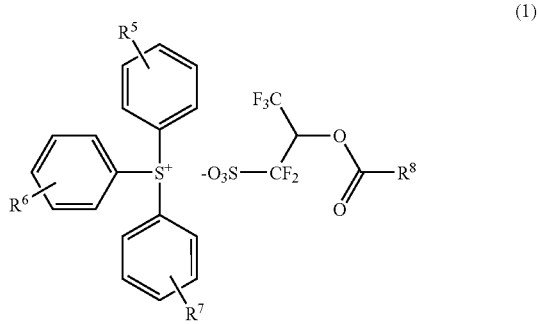
(1)

Herein $R^5$, $R^6$, and $R^7$ are each independently hydrogen or a straight, branched or cyclic, monovalent $C_1$-$C_{20}$ hydrocarbon group which may contain a heteroatom. Examples of hydrocarbon groups optionally containing a heteroatom include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-to-carbon bond is separated by a hetero-atomic grouping such as —O—, —S—, —SO—, —SO$_2$—, —NH—, —C(=O)—, —C(=O)O—, or —C(=O)NH—, or any hydrogen atom is replaced by a functional group such as —OH, —NH$_2$, —CHO, or —CO$_2$H. $R^8$ is a straight, branched or cyclic, monovalent $C_7$-$C_{30}$ hydrocarbon group which may contain a heteroatom, examples of which are exemplified below, but are not limited thereto.

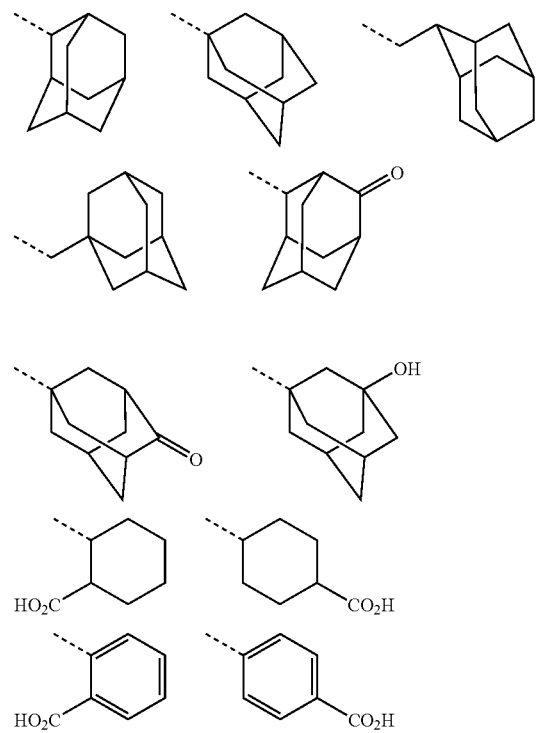

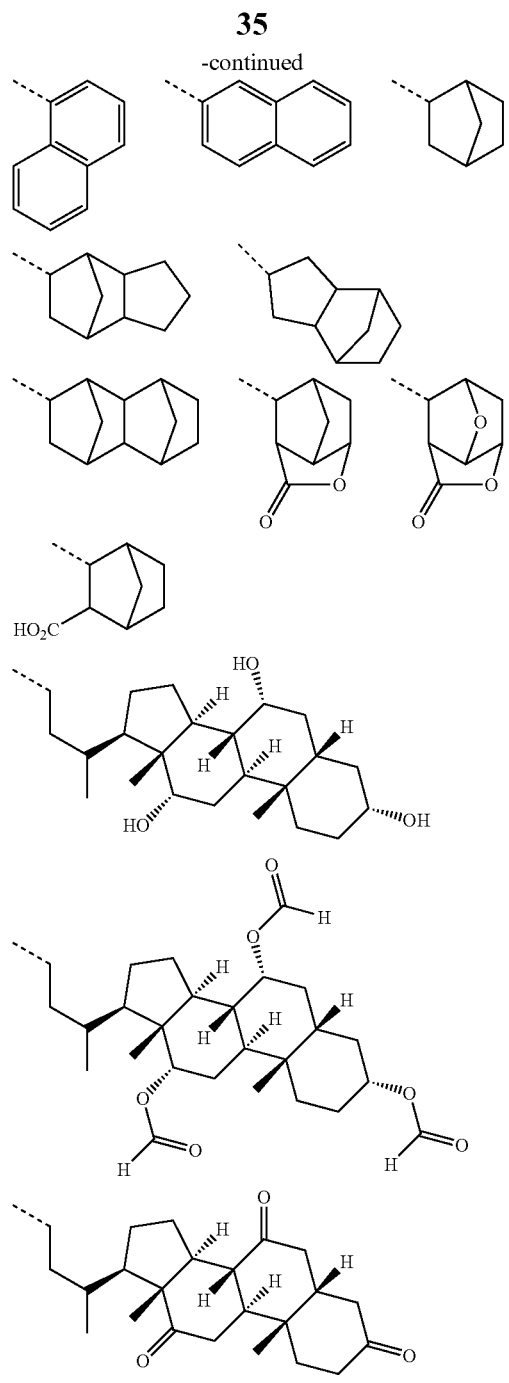
Illustrative examples of acid generators (1) are shown below.
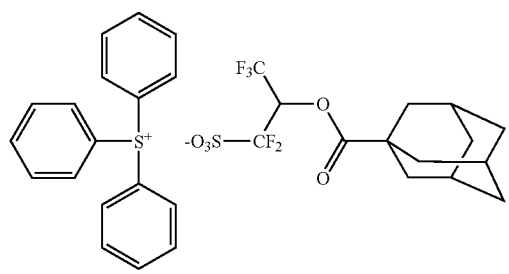
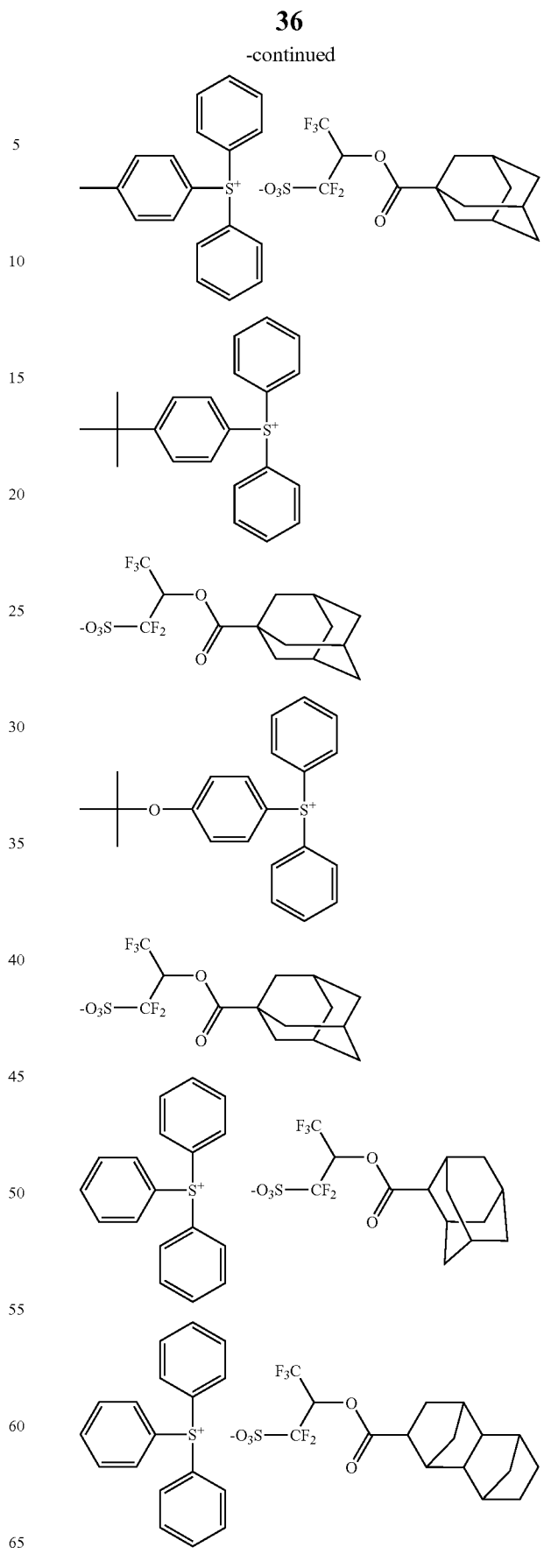

-continued
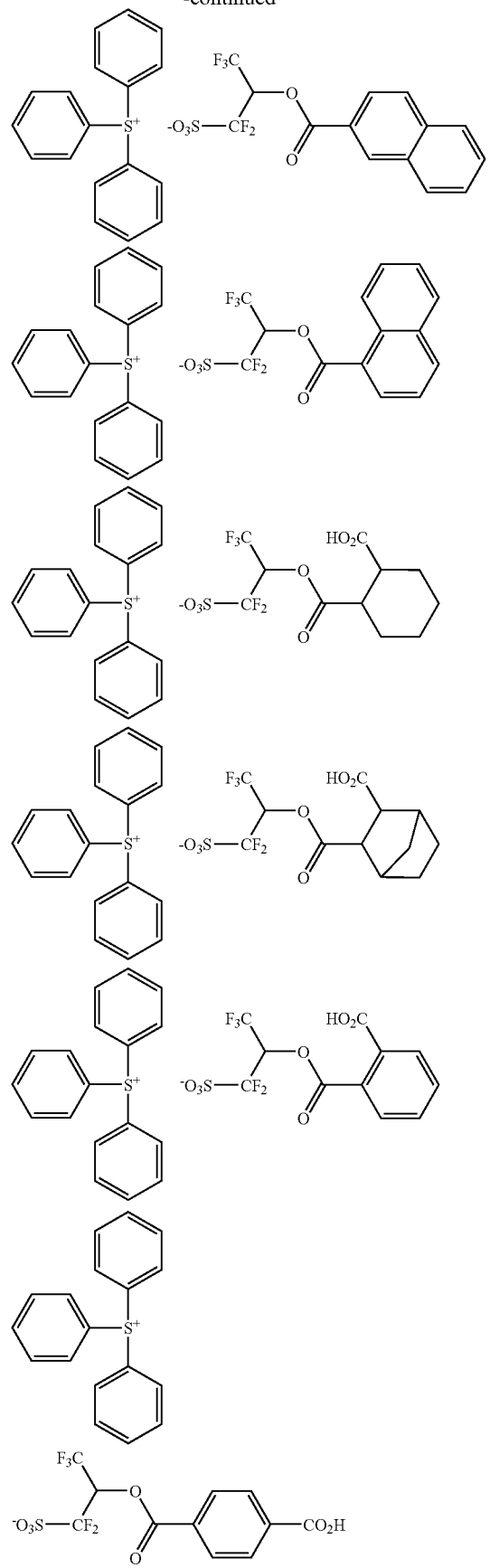
-continued
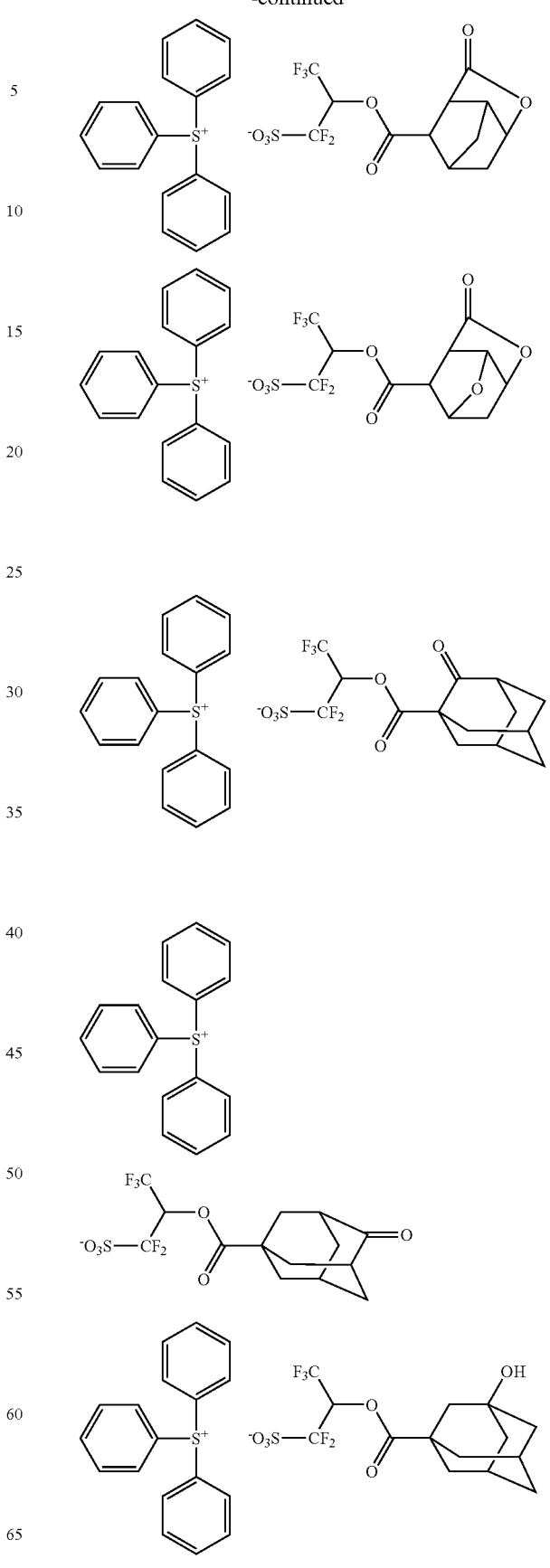

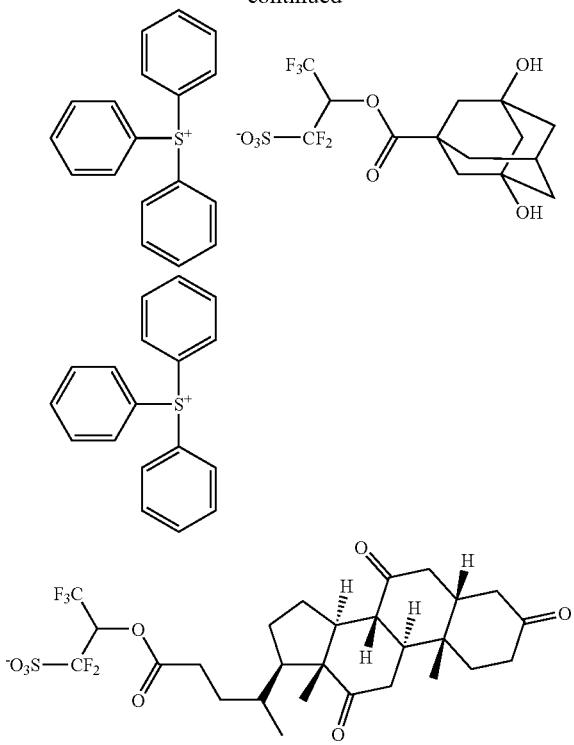

In the chemically amplified resist composition, the photoacid generator (B) may be added in any desired amount as long as the objects of the invention are not compromised. An appropriate amount of the photoacid generator (B) is 0.1 to 10 parts, and more preferably 0.1 to 5 parts by weight per 100 parts by weight of the base resin in the composition. Too high a proportion of the photoacid generator (B) may give rise to problems of degraded resolution and foreign matter upon development and resist film peeling. The photoacid generators (B) may be used alone or in admixture of two or more. The transmittance of the resist film can be controlled by using a photoacid generator having a low transmittance at the exposure wavelength and adjusting the amount of the photoacid generator added.

It is noted that an acid diffusion controlling function may be provided when the photoacid generator is an onium salt capable of generating a weak acid. Specifically, in a system using the inventive polymer capable of generating a strong acid in combination with an onium salt capable of generating a weak acid (e.g., non-fluorinated sulfonic acid or carboxylic acid), if the strong acid generated from the inventive polymer upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from the strong acid to the weak acid as above can take place, but it never happens that the weak acid collides with the unreacted onium salt capable of generating a strong acid to induce a salt exchange. This is because of a likelihood of an onium cation forming an ion pair with a stronger acid anion.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996).

Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition of the invention, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Organic Solvent

The organic solvent (C) used herein may be any organic solvent in which the base resin, acid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is 200 to 1,000 parts, especially 400 to 800 parts by weight per 100 parts by weight of the base resin.

Quencher

A quencher (D) may be optionally used in the resist composition of the invention. The term "quencher" as used herein has a meaning generally known in the art and refers to a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). A typical nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexyl-amine, N-tert-butoxycarbonylbenzimidazole, and oxazolidinone.

Suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, amine compounds of the following general formula (B)-1 may also be included alone or in admixture.

$$N(X)_n(Y)_{3-n} \quad \text{(B)-1}$$

In the formula, n is equal to 1, 2 or 3. The side chain X is independently selected from groups of the following general formulas (X)-1 to (X)-3. The side chain Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

$$-\!\!\!-\!\![R^{300}\!-\!O\!-\!R^{301}] \quad \text{(X)-1}$$

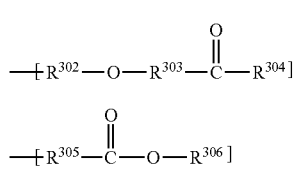

(X)-2

(X)-3

In the formulas, $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{20}$ alkyl groups in which some or all hydrogen atoms may be substituted by fluorine atoms and which may contain at least one hydroxyl group, ether group, ester group or lactone ring; $R^{303}$ is a single bond or a straight or branched $C_1$-$C_4$ alkylene group; $R^{306}$ is a straight, branched or cyclic $C_1$-$C_{20}$ alkyl group in which some or all hydrogen atoms may be substituted by fluorine atoms and which may contain at least one hydroxyl group, ether group, ester group or lactone ring.

Illustrative examples of the compounds of formula (B)-1 include, but are not limited to, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing amine compounds having the following general formula (B)-2.

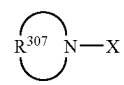

(B)-2

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Illustrative examples of the cyclic structure-bearing amine compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-[2-(2-methoxyethoxy)ethoxy]ethylmorpholine, 2-[2-(2-butoxyethoxy)ethoxy]ethylmorpholine, 2-{2-[2-(2-methoxyethoxy)ethoxy]ethoxy}ethylmorpholine, 2-{2-[2-(2-butoxyethoxy)ethoxy]ethoxy}ethylmorpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, and 2-morpholinoethyl adamantanecarboxylate.

Also, one or more of cyano-bearing amine compounds having the following general formulae (B)-3 to (B)-6 may be added.

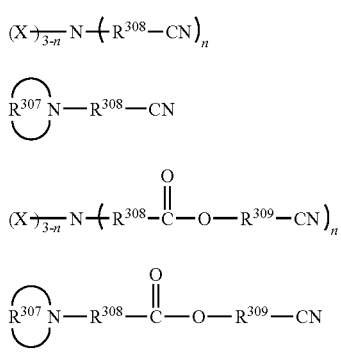

Herein, X, $R^{307}$ and n are as defined in formula (B)-1, and $R^{308}$ and $R^{309}$ each are independently a straight or branched $C_1$-$C_4$ alkylene group.

Illustrative examples of the cyano-bearing amine compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are amine compounds having an imidazole structure and a polar functional group, represented by the general formula (B)-7.

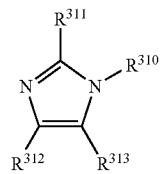

Herein, $R^{310}$ is a straight, branched or cyclic $C_2$-$C_{20}$ alkyl group in which some or all hydrogen atoms may be substituted by fluorine atoms and which has one or more polar functional groups. The polar functional group is selected from among hydroxyl, carbonyl, ester, ether, sulfide, carbonate, cyano and acetal groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Also included are amine compounds having a benzimidazole structure and a polar functional group, represented by the general formula (B)-8.

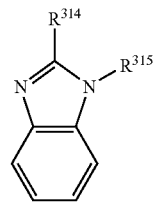

Herein, $R^{314}$ is a hydrogen atom, a straight, branched or cyclic $C_1$-$C_{10}$ alkyl group, aryl group or aralkyl group. $R^{315}$ is a straight, branched or cyclic $C_1$-$C_{20}$ alkyl group in which some or all hydrogen atoms may be substituted by fluorine atoms and which has one or more polar functional groups. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

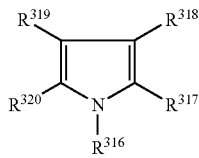
(B)-9

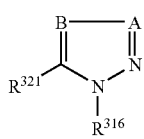
(B)-10

Herein, A is a nitrogen atom or ≡C—$R^{322}$. B is a nitrogen atom or ≡C—$R^{323}$. $R^{316}$ is a straight, branched or cyclic $C_2$-$C_{20}$ alkyl group in which some or all hydrogen atoms may be substituted by fluorine atoms and which has one or more polar functional groups, the polar functional group being selected from among hydroxyl, carbonyl, ester, ether, sulfide, carbonate, cyano and acetal groups and mixtures thereof. $R^{317}$, $R^{318}$, $R^{319}$ and $R^{320}$ are each independently a hydrogen atom, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring with the carbon atom to which they are attached. $R^{321}$ is a hydrogen atom, a straight, branched or cyclic $C_1$-$C_{10}$ alkyl group or aryl group. $R^{322}$ and $R^{323}$ each are a hydrogen atom, a straight, branched or cyclic $C_1$-$C_{10}$ alkyl group or aryl group, or a pair of $R^{321}$ and $R^{323}$, taken together, may form a benzene or naphthalene ring with the carbon atom to which they are attached.

Also included are organic nitrogen-containing compounds having an aromatic carboxylic acid ester structure, represented by the general formulae (B)-11 to (B)-14.

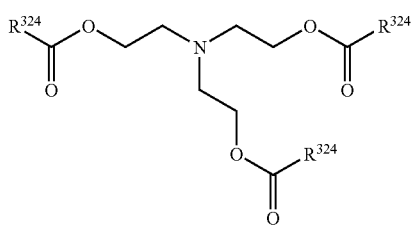
(B)-11

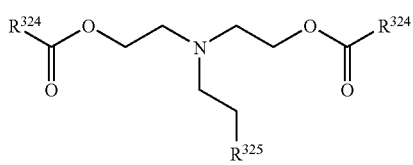
(B)-12

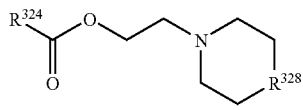
(B)-13

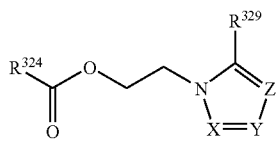
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are amine compounds of 7-oxanorbornane-2-carboxylic ester structure, represented by the general formula (B)-15.

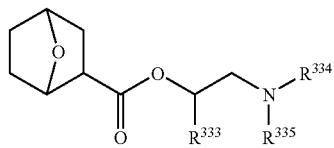
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a $C_2$-$C_{20}$ heterocyclic or hetero-aromatic ring with the nitrogen atom to which they are attached.

The quencher is preferably formulated in an amount of 0.001 to 2 parts, and especially 0.01 to 1 part by weight, per 100 parts by weight of the base resin. Less than 0.001 phr of the quencher may achieve no addition effect whereas more than 2 phr may lead to too low a sensitivity.

Surfactant

Optionally, the resist composition of the invention may further comprise (E) a surfactant which is commonly used for improving the coating characteristics. The surfactant may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08 and R30 (Dai-Nippon Ink & Chemicals, Inc.), Fluorad FC-430, FC-431, FC-4430 and FC-4432 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430, Surflon S-381, Surfynol E1004, KH-20 and KH-30 are preferred. These surfactants may be used alone or in admixture.

In the chemically amplified resist composition of the invention, the surfactant is preferably added in an amount of up to 2 parts, and especially up to 1 part by weight, per 100 parts by weight of the base resin.

In an embodiment wherein the resist composition of the invention is used in immersion lithography using water, especially in the absence of a resist protective coating, a surfactant may be added to the resist composition, the surfactant having a function to collect near the resist surface after spin coating to prevent or reduce water penetration or leaching. This surfactant is a polymeric surfactant which is insoluble in water and soluble in an alkaline developer, and preferably is highly water repellent and improves water slippage. Exemplary polymeric surfactants are those comprising monomeric units represented by the following formula.

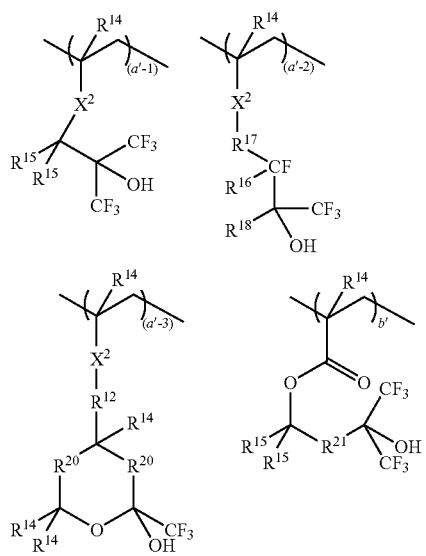

-continued

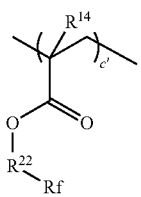

Herein $R^{14}$ is each independently hydrogen, fluorine, methyl or trifluoromethyl, $R^{15}$ is each independently hydrogen or a straight, branched or cyclic $C_1$-$C_{20}$ alkyl or fluoroalkyl group, or plural $R^{15}$ in a common monomer may bond together to form a ring with the carbon atom to which they are attached, and in this case, they collectively stand for a straight, branched or cyclic alkylene or fluoroalkylene group having 2 to 20 carbon atoms in total, $R^{16}$ is fluorine or hydrogen, or $R^{16}$ may bond with $R^{17}$ to form a non-aromatic ring having 3 to 10 carbon atoms in total with the carbon atom to which they are attached, $R^{17}$ is a straight, branched or cyclic $C_1$-$C_6$ alkylene group in which one or more hydrogen atoms may be replaced by fluorine atoms, $R^{18}$ is a straight or branched $C_1$-$C_{10}$ alkyl group in which one or more hydrogen atoms are replaced by fluorine atoms, or $R^{17}$ and $R^{18}$ may bond together to form a ring with the carbon atoms to which they are attached, and in this case, they collectively stand for a trivalent organic group having 2 to 12 carbon atoms in total, $R^{19}$ is a single bond or $C_1$-$C_4$ alkylene, $R^{20}$ is each independently a single bond, —O— or —CR$^{14}$R$^{14}$—, $R^{14}$ being as defined above, $R^{21}$ is a straight or branched $C_1$-$C_4$ alkylene group, or $R^{21}$ may bond with $R^{15}$ within a common monomer to form a $C_4$-$C_7$ non-aromatic ring with the carbon atom to which they are attached, $R^{22}$ is 1,2-ethylene, 1,3-propylene or 1,4-butylene, Rf is a straight perfluoroalkyl group of 3 to 6 carbon atoms, or 3H-perfluoropropyl, 4H-perfluorobutyl, 5H-perfluoropentyl or 6H-perfluorohexyl, $X^2$ is each independently —C(=O)—O—, —O—, or —C(=O)—R$^{23}$—C(=O)—O— wherein $R^{23}$ is a straight, branched or cyclic $C_1$-$C_{10}$ alkylene group, and the subscripts are numbers in the range: $0 \leq (a'-1) < 1$, $0 \leq (a'-2) < 1$, $0 \leq (a'-3) < 1$, $0 < (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

In the resist composition, the polymeric surfactant is added in an amount of 0.001 to 20 parts, and preferably 0.01 to 10 parts by weight, per 100 parts by weight of the base resin. With respect to the polymeric surfactant, reference should be made to JP-A 2007-297590.

While the resist composition of the invention typically comprises the inventive polymer as a base resin, acid generator, organic solvent and quencher as described above, there may be added optional other ingredients such as dissolution inhibitors, acidic compounds, stabilizers, and dyes. Optional ingredients may be added in conventional amounts so long as this does not compromise the objects of the invention.

In forming a pattern from the resist composition of the invention, any well-known lithography may be employed. For example, the composition is applied onto a substrate for integrated circuitry fabrication (e.g., Si, $SiO_2$, SiN, SiON, TiN, WSi, BPSG, SOG, organic antireflective coating, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.05 to 2.0 µm thick. A patterning mask having the desired pattern is then placed over the resist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. Alternatively, pattern formation may be performed by writing imagewise with an electron beam directly (not through a mask). Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV having a wavelength of 250 to 190 nm, excimer laser, x-ray, or electron beam. The desired pattern may not be obtainable outside the upper and lower limits of the above range.

The water-insoluble protective coating which is used in the immersion lithography is to prevent the resist coating from being leached and to improve water slippage at the coating surface and is generally divided into two types. The first type is an organic solvent-strippable protective coating which must be stripped, prior to alkaline development, with an organic solvent in which the resist coating is not dissolvable. The second type is an alkali-soluble protective coating which is soluble in an alkaline developer so that it can be removed simultaneously with the removal of solubilized areas of the resist coating. The protective coating of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective coating of the second type is formed.

Any desired step may be added to the pattern forming process. For example, after a photoresist coating is formed, a step of rinsing with pure water (post-soaking) may be introduced to extract the acid generator or the like from the coating surface or wash away particles. After exposure, a step of rinsing (post-soaking) may be introduced to remove any water remaining on the coating after exposure.

EXAMPLE

Examples and Comparative Examples are given below by way of illustration and not by way of limitation.

Reference Example

Synthesis of sodium 2-(pivaloyloxy)-1,1-difluoroethanesulfonate [Anion Intermediate]

Pivalic chloride and 2-bromo-2,2-difluoroethanol were mixed in tetrahydrofuran and ice cooled. Triethylamine was added to the mixture. Subsequent standard separatory operation and solvent distillation gave 2-bromo-2,2-difluoroethyl pivalate. This compound was converted into a sodium sulfinate using sodium dithionite and then oxidized with hydrogen peroxide, yielding the target compound, sodium 2-(pivaloyloxy)-1,1-difluoroethanesulfonate.

Synthesis of carboxylic ester is well known, and synthesis of sulfinic acid and sulfonic acid from alkyl halide is also well known. The latter is described, for example, in JP-A 2004-2252.

Synthesis of triphenylsulfonium 2-(pivaloyloxy)-1,1-difluoroethanesulfonate [PAG Intermediate 1]

In 700 g of dichloromethane and 400 g of water were dissolved 159 g (0.37 mol) of sodium 2-(pivaloyloxy)-1,1-difluoroethanesulfonate (purity 63%) and 132 g (0.34 mol) of triphenylsulfonium iodide. The organic layer was separated, washed three times with 200 g of water, and concentrated. Diethyl ether was added to the concentrate for recrystallization, obtaining the target compound as white crystals. 164 g (yield 95%).

Synthesis of triphenylsulfonium 1,1-difluoro-2-hydroxy-ethanesulfonate [PAG Intermediate 2]

Triphenylsulfonium 2-(pivaloyloxy)-1,1-difluoroethanesulfonate, 243.5 g (0.48 mol), was dissolved in 760 g of methanol and ice cooled. A sodium hydroxide solution (40 g of sodium hydroxide in 120 g of water) was added dropwise to the solution at a temperature below 5° C. It was aged at room temperature for 8 hours. At a temperature below 10° C., dilute hydrochloric acid (99.8 g of 12N hydrochloric acid in 200 g of water) was added to the mixture to quench the reaction. Methanol was distilled off in vacuum, after which 1,000 g of dichloromethane was added to the residue. The organic layer was washed three times with 30 g of saturated sodium chloride water. The organic layer was concentrated, after which 1 L of diisopropyl ether was added to the concentrate for crystallization. The crystals were filtered and dried, obtaining the target compound. 187 g (purity 78%, net yield 78%).

Synthesis of triphenylsulfonium 1,1-difluoro-2-methacryloyloxyethanesulfonate [MPAG-1]

Triphenylsulfonium 1,1-difluoro-2-hydroxyethane-sulfonate (purity 63%) was dissolved in a 5-fold amount (by weight) of acetonitrile, to which 1 equivalent of triethylamine and 0.05 equivalent of 4-N,N-dimethylaminopyridine were added. The mixture was cooled in an ice bath. At a temperature below 5° C., 1.1 equivalents of methacrylic anhydride was added dropwise to the mixture, which was stirred at room temperature for 2 hours. Dilute hydrochloric acid was added to the reaction solution to turn it acidic, after which the solvent was distilled off in vacuum. Dichloromethane and water were added to the residue. The organic layer was separated and washed with water, and the solvent was distilled off in vacuum. Diethyl ether was added to the residue for re-precipitation. The target compound was thus purified and collected as an oily matter. Yield 70%.

Figure 2:
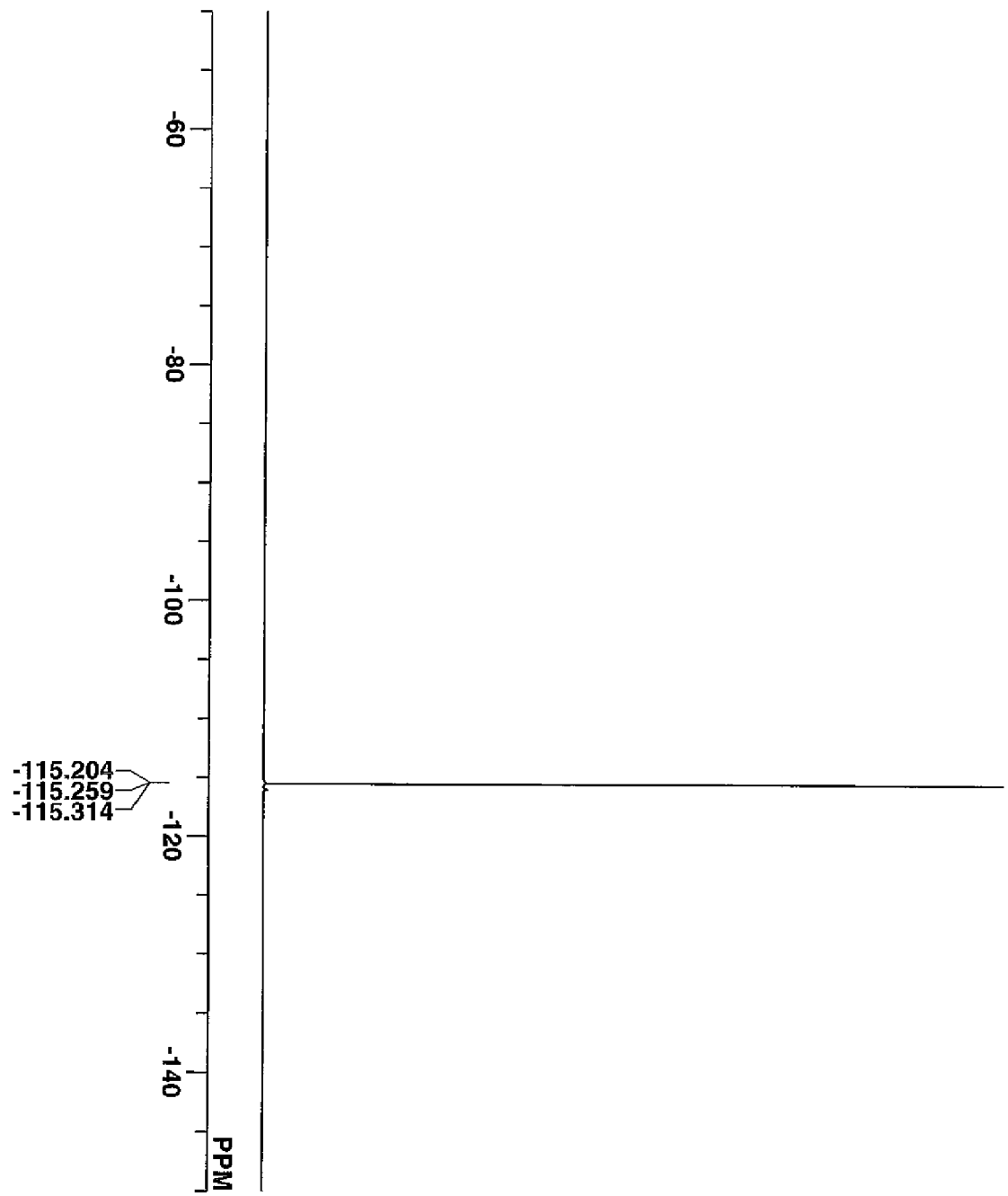
FIG. 2 is a diagram showing the $^{19}$F-NMR spectrum of MPAG-1.

The compound was analyzed by nuclear magnetic resonance spectroscopy in DMSO-d6 solvent. FIG. 1 is a $^1$H-NMR diagram of triphenylsulfonium 1,1-difluoro-2-methacryloyloxyethanesulfonate MPAG-1. FIG. 2 is a $^{19}$F-NMR diagram of MPAG-1.

Example 1

Polymers within the scope of the invention were synthesized in accordance with the following formulation.

Example 1-1

Synthesis of Polymer 1

In a nitrogen atmosphere flask, a monomer solution was prepared by combining 7.98 g of triphenylsulfonium 1,1-difluoro-2-methacryloyloxyethanesulfonate, 13.34 g of 4-ethyltetracyclo[6.2.1.1$^{3,6}$.0$^{2,7}$]dodecanyl methacrylate, 11.03 g of tetrahydro-2-oxo-4-furanyl methacrylate, 7.66 g of 3-hydroxy-1-adamantyl methacrylate, 1.11 g of 2,2'-azobisisobutyronitrile, and 70.0 g of methyl ethyl ketone (MEK). In another nitrogen atmosphere flask, 23.3 g of MEK was heated at 80° C. with stirring, after which the monomer solution was added dropwise over 4 hours. After the completion of dropwise addition, the polymerization solution was stirred for 2 hours while its temperature was kept at 80° C. Thereafter, the solution was cooled to room temperature. The polymerization solution was added dropwise to 400 g of hexane under vigorous stirring, after which the precipitating copolymer was filtered out. The copolymer was washed twice with a mixture of 45.4 g MEK and 194.6 g hexane and then dried in vacuum at 50° C. for 20 hours. There was obtained 38.7 g of the copolymer as white powder. The copolymer was analyzed by $^{13}$C-NMR spectroscopy, finding a copolymer compositional ratio of 10/30/40/20 mol % in the described order of monomers.

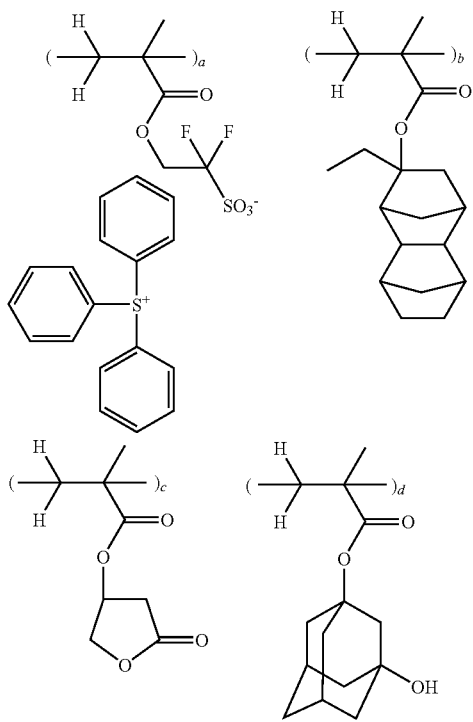

Example 1-2

Synthesis of Polymer 2

In a nitrogen atmosphere flask, a monomer solution was prepared by combining 7.78 g of triphenylsulfonium 1,1-difluoro-2-methacryloyloxyethanesulfonate, 13.00 g of 4-ethyltetracyclo[6.2.1.1$^{3,6}$.0$^{2,7}$]dodecanyl methacrylate, 7.08 g of 4,8-dioxa-5-oxotricyclo[4.2.1.0$^{3,7}$]nonan-2-yl methacrylate, 12.14 g of 4-(1-(ethoxy)ethoxy)styrene, 1.11 g of 2,2'-azobisisobutyronitrile, and 70.0 g of MEK. In another nitrogen atmosphere flask, 23.3 g of MEK was heated at 80° C. with stirring, after which the monomer solution was added dropwise over 4 hours. After the completion of dropwise addition, the polymerization solution was stirred for 2 hours while its temperature was kept at 80° C. Thereafter, the solution was cooled to room temperature. The polymerization solution was added dropwise to 400 g of hexane under vigorous stirring, after which the precipitating copolymer was filtered out. The copolymer was washed twice with a mixture of 45.4 g MEK and 194.6 g hexane and then dried in vacuum at 50° C. for 20 hours. There was obtained 38.7 g of the copolymer as white powder. The copolymer was dissolved in 170 g of a 1:1 (by volume) mixture of tetrahydrofuran and methanol. Then 0.8 g of oxalic acid dihydrate was added to the solution, which was heated at 40° C. for 48 hours. The reaction solution, to which pyridine was added, was concentrated. The concentrate was dissolved in a mixture of tetrahydrofuran and ethyl acetate, and washed with water. The organic layer was concentrated again, dissolved in a small volume of tetrahydrofuran, and added dropwise to hexane. The precipitating copolymer was filtered out and dried in vacuum at 50° C. for 20 hours. There was obtained 34.0 g of the copolymer as white powder. The copolymer was analyzed by $^{13}$C-NMR spectroscopy, finding a copolymer compositional ratio of 10/30/20/40 mol % in the described order of monomers.

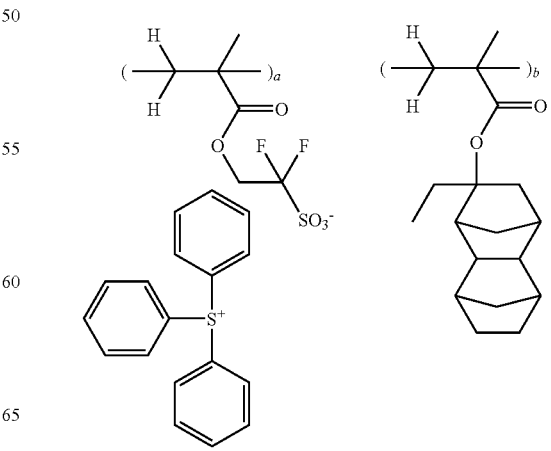

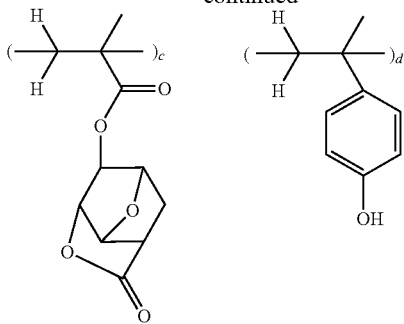

Examples 1-3 to 1-39 & Comparative Examples 1-1 to 1-4

Synthesis of Polymers 3 to 39 and Polymers 47 to 50

A series of resins shown in Table 1 were prepared by the same procedure as in Example 1-1 except that the type and blending ratio (molar ratio) of monomers were changed. The units shown in Table 1 have the structures shown in Tables 2 to 6. In Table 1, the ratio is on a molar basis.

Examples 1-40 to 1-45 & Comparative Example 1-5

Synthesis of Polymers 40 to 45 and 51

Polymers 34 to 39 and 50 prepared in accordance with the above formulation were subjected to deprotection reaction as in Example 1-2, yielding the target polymers.

Example 1-46 & Comparative Example 1-6

Synthesis of Polymers 46 and 52

Polymers 40 and 51 were reacted with 1-chloro-1-methoxy-2-methylpropane under basic conditions, yielding the target polymers 46 and 52.

With respect to deprotection and protection of polyhydroxystyrene derivatives, reference should be made to JP-A 2004-115630 and JP-A 2005-8766.

TABLE 1

|  |  | Resin | Unit 1 (ratio) | Unit 2 (ratio) | Unit 3 (ratio) | Unit 4 (ratio) | Unit 5 (ratio) |
|---|---|---|---|---|---|---|---|
| Example | 1-3 | Polymer 3 | PM-1 (0.10) | A-6M (0.25) | B-1M (0.22) | B-3M (0.33) | C-3M (0.10) |
|  | 1-4 | Polymer 4 | PM-1 (0.10) | A-6M (0.25) | B-1M (0.22) | B-6M (0.33) | C-3M (0.10) |
|  | 1-5 | Polymer 5 | PM-1 (0.10) | A-1M (0.25) | B-1M (0.22) | B-3M (0.33) | C-3M (0.10) |
|  | 1-6 | Polymer 6 | PM-1 (0.10) | A-1M (0.25) | B-1M (0.22) | B-6M (0.33) | C-3M (0.10) |
|  | 1-7 | Polymer 7 | PM-1 (0.10) | A-1M (0.35) | B-1M (0.22) | B-3M (0.33) |  |
|  | 1-8 | Polymer 8 | PM-1 (0.10) | A-1M (0.35) | B-1M (0.22) | B-5M (0.33) |  |
|  | 1-9 | Polymer 9 | PM-1 (0.10) | A-3M (0.35) | B-1M (0.22) | B-6M (0.33) |  |
|  | 1-10 | Polymer 10 | PM-1 (0.10) | A-3M (0.35) | B-1M (0.22) | B-4M (0.33) |  |
|  | 1-11 | Polymer 11 | PM-1 (0.10) | A-1M (0.25) | B-1M (0.22) | B-3M (0.33) | C-1M (0.10) |
|  | 1-12 | Polymer 12 | PM-1 (0.10) | A-1M (0.30) | B-1M (0.22) | B-3M (0.33) | C-5M (0.05) |
|  | 1-13 | Polymer 13 | PM-1 (0.10) | A-4M (0.35) | B-1M (0.22) | B-6M (0.33) |  |
|  | 1-14 | Polymer 14 | PM-1 (0.10) | A-4M (0.35) | B-1M (0.22) | B-3M (0.33) |  |
|  | 1-15 | Polymer 15 | PM-1 (0.10) | A-1M (0.25) | B-1M (0.22) | B-3M (0.33) | C-2M (0.10) |
|  | 1-16 | Polymer 16 | PM-1 (0.10) | A-1M (0.25) | B-1M (0.22) | B-3M (0.33) | C-4M (0.10) |
|  | 1-17 | Polymer 17 | PM-1 (0.10) | A-6M (0.25) | B-1M (0.22) | B-3M (0.33) | C-4M (0.10) |
|  | 1-18 | Polymer 18 | PM-1 (0.10) | A-3M (0.25) | B-1M (0.22) | B-3M (0.33) | C-4M (0.10) |
|  | 1-19 | Polymer 19 | PM-1 (0.10) | A-1M (0.20) | A-5M (0.15) | B-1M (0.15) | B-6M (0.20) |
|  | 1-20 | Polymer 20 | PM-1 (0.10) | A-3M (0.25) | B-1M (0.22) | B-6M (0.33) | B-7M (0.10) |
|  | 1-21 | Polymer 21 | PM-2 (0.10) | A-2M (0.35) | B-1M (0.22) | B-3M (0.33) |  |
|  | 1-22 | Polymer 22 | PM-1 (0.10) | A-1M (0.20) | A-2M (0.15) | B-1M (0.22) | B-3M (0.33) |
|  | 1-23 | Polymer 23 | PM-1 (0.10) | A-3M (0.25) | B-1M (0.22) | B-4M (0.33) | B-7M (0.10) |
|  | 1-24 | Polymer 24 | PM-1 (0.10) | A-1M (0.25) | B-1M (0.22) | B-4M (0.33) | B-7M (0.10) |
|  | 1-25 | Polymer 25 | PM-1 (0.10) | A-1M (0.35) | B-2M (0.22) | B-6M (0.33) |  |
|  | 1-26 | Polymer 26 | PM-1 (0.10) | A-2M (0.35) | B-1M (0.15) | B-6M (0.25) | C-3M (0.10) |
|  | 1-27 | Polymer 27 | PM-1 (0.10) | A-5M (0.25) | B-1M (0.22) | B-3M (0.33) | C-2M (0.10) |
|  | 1-28 | Polymer 28 | PM-1 (0.05) | A-6M (0.30) | B-1M (0.22) | B-3M (0.33) | C-3M (0.10) |
|  | 1-29 | Polymer 29 | PM-1 (0.05) | A-6M (0.30) | B-1M (0.22) | B-6M (0.33) | C-3M (0.10) |
|  | 1-30 | Polymer 30 | PM-1 (0.05) | A-1M (0.30) | B-1M (0.22) | B-3M (0.33) | C-1M (0.10) |
|  | 1-31 | Polymer 31 | PM-1 (0.05) | A-5M (0.30) | B-1M (0.22) | B-3M (0.33) | C-1M (0.10) |
|  | 1-32 | Polymer 32 | PM-1 (0.05) | A-3M (0.30) | B-1M (0.22) | B-6M (0.33) | B-7M (0.10) |
|  | 1-33 | Polymer 33 | PM-1 (0.05) | A-1M (0.30) | C-4M (0.65) |  |  |
|  | 1-34 | Polymer 34 | PM-1 (0.15) | D-2 (0.85) |  |  |  |
|  | 1-35 | Polymer 35 | PM-1 (0.15) | D-2 (0.65) | D-5 (0.20) |  |  |
|  | 1-36 | Polymer 36 | PM-1 (0.15) | D-2 (0.65) | D-6 (0.20) |  |  |
|  | 1-37 | Polymer 37 | PM-1 (0.15) | D-2 (0.55) | D-4 (0.20) | D-7 (0.10) |  |
|  | 1-38 | Polymer 38 | PM-1 (0.15) | D-2 (0.55) | A-1M (0.20) | D-7 (0.10) |  |
|  | 1-39 | Polymer 39 | PM-1 (0.05) | D-2 (0.55) | D-5 (0.20) | D-8 (0.20) |  |
|  | 1-40 | Polymer 40 | PM-1 (0.15) | D-1 (0.80) |  |  |  |
|  | 1-41 | Polymer 41 | PM-1 (0.15) | D-1 (0.65) | D-5 (0.20) |  |  |
|  | 1-42 | Polymer 42 | PM-1 (0.15) | D-1 (0.65) | D-6 (0.20) |  |  |
|  | 1-43 | Polymer 43 | PM-1 (0.15) | D-1 (0.55) | D-4 (0.20) | D-7 (0.10) |  |
|  | 1-44 | Polymer 44 | PM-1 (0.15) | D-1 (0.55) | A-1M (0.20) | D-7 (0.10) |  |
|  | 1-45 | Polymer 45 | PM-1 (0.05) | D-1 (0.55) | D-5 (0.20) | D-9 (0.20) |  |
|  | 1-46 | Polymer 46 | PM-1 (0.15) | D-1 (0.55) | D-3 (0.20) |  |  |

TABLE 1-continued
|  | Resin | Unit 1 (ratio) | Unit 2 (ratio) | Unit 3 (ratio) | Unit 4 (ratio) | Unit 5 (ratio) |
|---|---|---|---|---|---|---|
| Comparative Synthesis Example | 1-1 Polymer 47 |  | A-6M (0.35) | B-1M (0.22) | B-3M (0.33) | C-3M (0.10) |
|  | 1-2 Polymer 48 |  | A-1M (0.35) | B-1M (0.25) | B-3M (0.45) |  |
|  | 1-3 Polymer 49 |  | A-1M (0.35) | B-1M (0.22) | B-3M (0.33) | C-1M (0.10) |
|  | 1-4 Polymer 50 |  | D-2 (1.0) |  |  |  |
|  | 1-5 Polymer 51 |  | D-1 (1.0) |  |  |  |
|  | 1-6 Polymer 52 |  | D-1 (0.75) | D-3 (0.25) |  |  |
TABLE 2
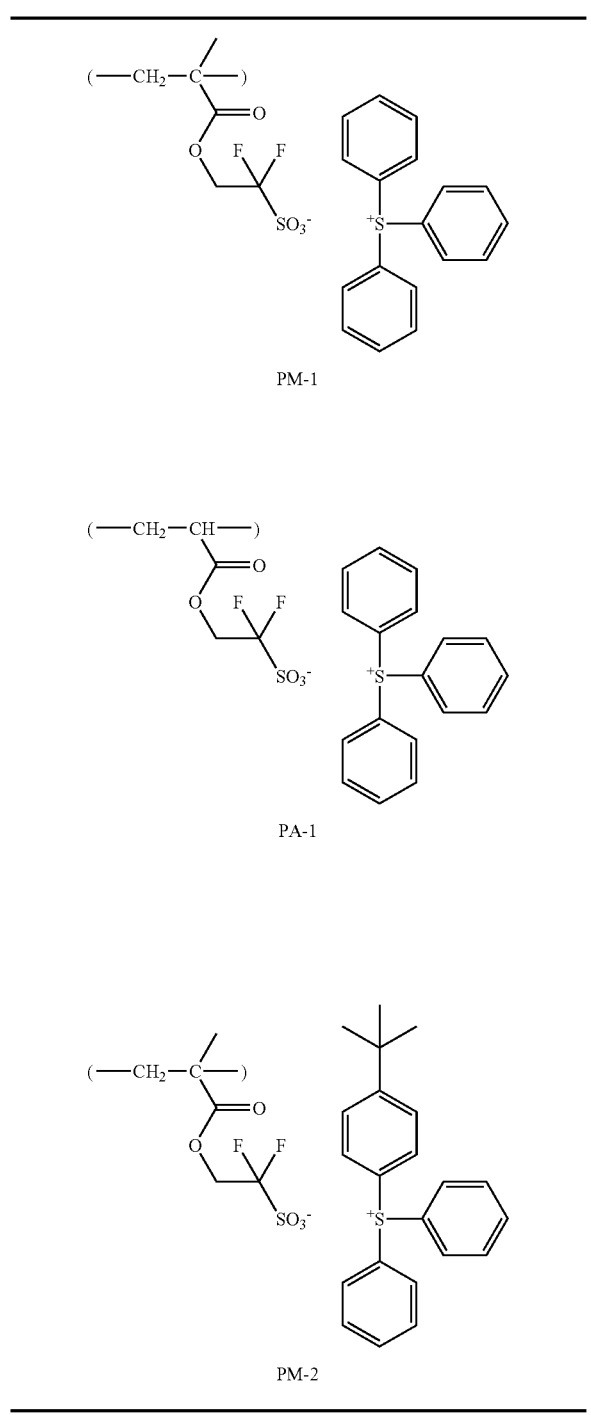
TABLE 3
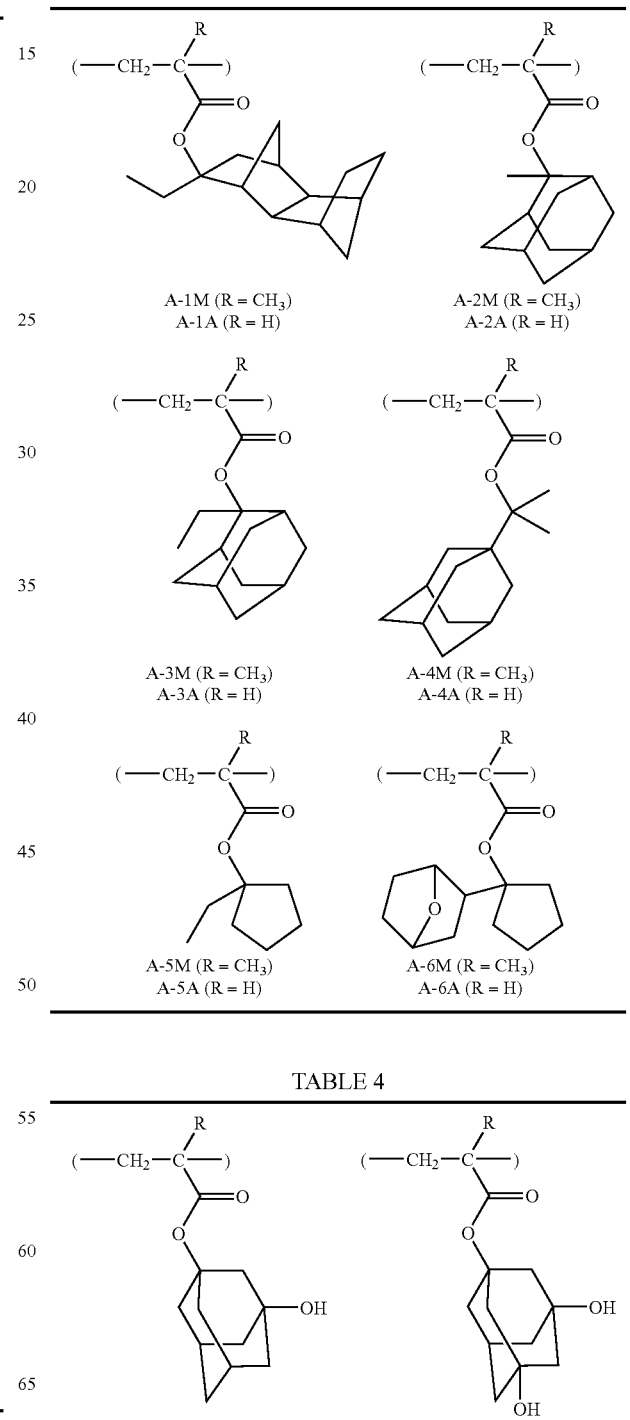
TABLE 4

TABLE 4-continued
B-1M (R = CH₃)
B-1A (R = H)
B-2M (R = CH₃)
B-2A (R = H)
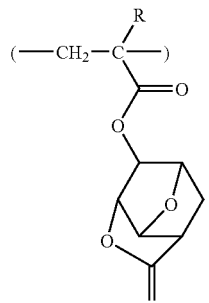
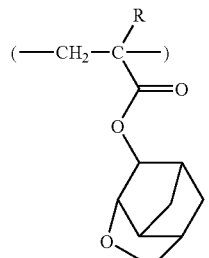
B-3M (R = CH₃)
B-3A (R = H)
B-4M (R = CH₃)
B-4A (R = H)
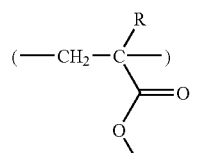
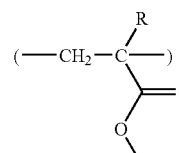
B-5M (R = CH₃)
B-5A (R = H)
B-6M (R = CH₃)
B-6A (R = H)
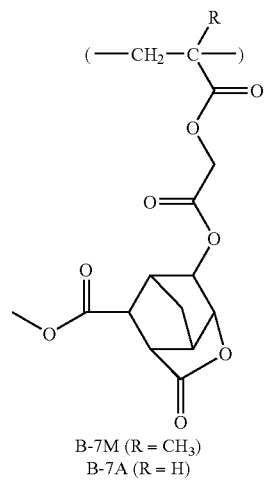
B-7M (R = CH₃)
B-7A (R = H)
TABLE 5
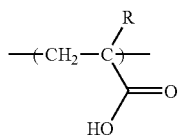
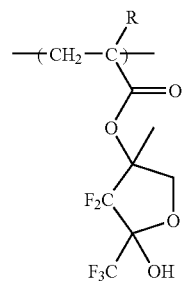
TABLE 5-continued
C-1M (R = CH₃)
C-1A (R = H)
C-2M (R = CH₃)
C-2A (R = H)
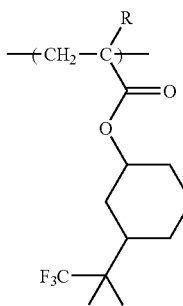
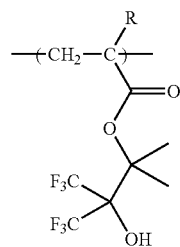
C-3M (R = CH₃)
C-3A (R = H)
C-4M (R = CH₃)
C-4A (R = H)
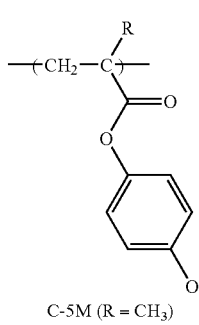
C-5M (R = CH₃)
C-5A (R = H)
TABLE 6
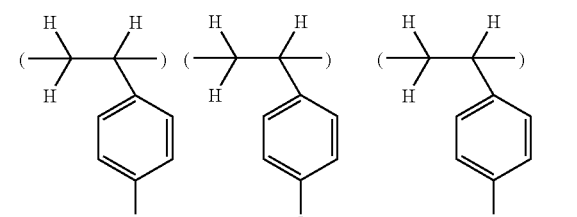
D-1      D-2      D-3
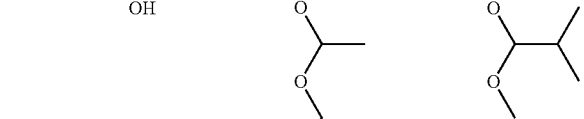
D-4      D-5      D-6

TABLE 6-continued

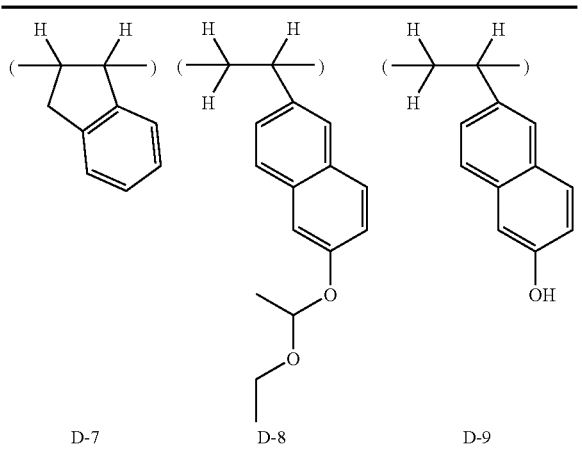

Preparation of Resist Composition

Examples 2-1 to 2-40 & Comparative Examples 2-1 to 2-4

Resist compositions were prepared by mixing and dissolving a polymer, acid generator, and quencher (or base) in a solvent according to the formulation shown in Table 7. The polymer used was selected from inventive resins: Polymers 1 to 33, 41 to 46 (P-01 to 33, P-41 to 46) and comparative resins: Polymers 47 to 49 and 52 (P-47 to 49 and 52). They were filtered through a Teflon® filter having a pore size of 0.2 μm, giving inventive resist compositions (R-01 to 40) and comparative resist compositions (R-60 to 63). In all runs, the solvent contained 0.01 wt % of surfactant KH-20 (Asahi Glass Co., Ltd.).

TABLE 7

|  |  | Resist composition | Resin (pbw) | PAG (pbw) | Base (pbw) | Solvent 1 (pbw) | Solvent 2 (pbw) |
|---|---|---|---|---|---|---|---|
| Example | 2-1 | R-01 | P-01 (80) |  | Base-1 (1.22) | PGMEA (560) | CyHO (240) |
|  | 2-2 | R-02 | P-03 (80) |  | Base-1 (1.22) | PGMEA (560) | CyHO (240) |
|  | 2-3 | R-03 | P-04 (80) |  | Base-1 (1.22) | PGMEA (560) | CyHO (240) |
|  | 2-4 | R-04 | P-05 (80) |  | Base-1 (1.22) | PGMEA (560) | CyHO (240) |
|  | 2-5 | R-05 | P-06 (80) |  | Base-1 (1.22) | PGMEA (560) | CyHO (240) |
|  | 2-6 | R-06 | P-07 (80) |  | Base-1 (1.22) | PGMEA (560) | CyHO (240) |
|  | 2-7 | R-07 | P-08 (80) |  | Base-1 (1.22) | PGMEA (560) | CyHO (240) |
|  | 2-8 | R-08 | P-09 (80) |  | Base-1 (1.22) | PGMEA (560) | CyHO (240) |
|  | 2-9 | R-09 | P-10 (80) |  | Base-1 (1.22) | PGMEA (560) | CyHO (240) |
|  | 2-10 | R-10 | P-11 (80) |  | Base-1 (1.22) | PGMEA (560) | CyHO (240) |
|  | 2-11 | R-11 | P-12 (80) |  | Base-1 (1.22) | PGMEA (560) | CyHO (240) |
|  | 2-12 | R-12 | P-13 (80) |  | Base-1 (1.22) | PGMEA (560) | CyHO (240) |
|  | 2-13 | R-13 | P-14 (80) |  | Base-1 (1.22) | PGMEA (560) | CyHO (240) |
|  | 2-14 | R-14 | P-15 (80) |  | Base-1 (1.22) | PGMEA (560) | CyHO (240) |
|  | 2-15 | R-15 | P-16 (80) |  | Base-1 (1.22) | PGMEA (560) | CyHO (240) |
|  | 2-16 | R-16 | P-17 (80) |  | Base-1 (1.22) | PGMEA (560) | CyHO (240) |
|  | 2-17 | R-17 | P-18 (80) |  | Base-1 (1.22) | PGMEA (560) | CyHO (240) |
|  | 2-18 | R-18 | P-19 (80) |  | Base-1 (1.22) | PGMEA (560) | CyHO (240) |
|  | 2-19 | R-19 | P-20 (80) |  | Base-1 (1.22) | PGMEA (560) | CyHO (240) |
|  | 2-20 | R-20 | P-21 (80) |  | Base-1 (1.22) | PGMEA (560) | CyHO (240) |
|  | 2-21 | R-21 | P-22 (80) |  | Base-1 (1.22) | PGMEA (560) | CyHO (240) |
|  | 2-22 | R-22 | P-23 (80) |  | Base-1 (1.22) | PGMEA (560) | CyHO (240) |
|  | 2-23 | R-23 | P-24 (80) |  | Base-1 (1.22) | PGMEA (560) | CyHO (240) |
|  | 2-24 | R-24 | P-25 (80) |  | Base-1 (1.22) | PGMEA (560) | CyHO (240) |
|  | 2-25 | R-25 | P-26 (80) |  | Base-1 (1.22) | PGMEA (560) | CyHO (240) |
|  | 2-26 | R-26 | P-27 (80) |  | Base-1 (1.22) | PGMEA (560) | CyHO (240) |
|  | 2-27 | R-27 | P-28 (80) |  | Base-1 (0.94) | PGMEA (560) | CyHO (240) |
|  | 2-28 | R-28 | P-29 (80) | PAG-1 (5.1) | Base-1 (1.22) | PGMEA (560) | CyHO (240) |
|  | 2-29 | R-29 | P-30 (80) |  | Base-1 (0.94) | PGMEA (560) | CyHO (240) |
|  | 2-30 | R-30 | P-31 (80) | PAG-1 (5.1) | Base-1 (1.22) | PGMEA (560) | CyHO (240) |
|  | 2-31 | R-31 | P-32 (80) |  | Base-1 (0.94) | PGMEA (560) | CyHO (240) |
|  | 2-32 | R-32 | P-33 (80) | PAG-1 (5.1) | Base-1 (1.22) | PGMEA (560) | CyHO (240) |
|  | 2-33 | R-33 | P-01 (40) P-07 (40) |  | Base-1 (1.22) | PGMEA (560) | CyHO (240) |
|  | 2-34 | R-34 | P-02 (80) |  | Base-1 (0.94) | PGMEA (560) | CyHO (240) |
|  | 2-35 | R-35 | P-41 (80) |  | Base-1 (0.94) | PGMEA (560) | EL (240) |
|  | 2-36 | R-36 | P-42 (80) |  | Base-1 (0.94) | PGMEA (560) | EL (240) |
|  | 2-37 | R-37 | P-43 (80) |  | Base-1 (0.94) | PGMEA (560) | EL (240) |
|  | 2-38 | R-38 | P-44 (80) |  | Base-1 (0.94) | PGMEA (560) | EL (240) |
|  | 2-39 | R-39 | P-45 (80) |  | Base-1 (0.94) | PGMEA (560) | EL (240) |
|  | 2-40 | R-40 | P-46 (80) |  | Base-1 (0.94) | PGMEA (560) | EL (240) |

TABLE 7-continued

| | | Resist composition | Resin (pbw) | PAG (pbw) | Base (pbw) | Solvent 1 (pbw) | Solvent 2 (pbw) |
|---|---|---|---|---|---|---|---|
| Comparative Example | 2-1 | R-60 | P-47 (80) | PAG-2 (8.7) | Base-1 (1.22) | PGMEA (560) | CyHO (240) |
| | 2-2 | R-61 | P-48 (80) | PAG-1 (10.1) | Base-1 (1.22) | PGMEA (560) | CyHO (240) |
| | 2-3 | R-62 | P-49 (80) | PAG-1 (10.1) | Base-1 (1.22) | PGMEA (560) | CyHO (240) |
| | 2-4 | R-63 | P-52 (80) | PAG-2 (15.0) | Base-1 (0.94) | PGMEA (560) | EL (240) |

In Table 7, numerical values in parentheses are in parts by weight. The abbreviations for the acid generator (PAG), quencher (base) and solvent have the following meaning.
PAG-1: triphenylsulfonium 2-(adamantane-1-carbonyloxy)-1,1,3,3,3-pentafluoropropane-1-sulfonate
PAG-2: triphenylsulfonium perfluorobutane-1-sulfonate
Base-1: tri(2-methoxymethoxyethyl)amine
PGMEA: 1-methoxy-2-propyl acetate
CyHO: cyclohexanone
EL: ethyl lactate

Evaluation of Resolution and LER on ArF Lithography

Examples 3-1 to 3-33 & Comparative Examples 3-1 to 3-3

Each of inventive resist compositions R-01 to 33 and comparative resist compositions R-60 to 62, prepared above, was spin coated on a silicon wafer having an antireflective coating (ARC-29A, by Nissan Chemical Co., Ltd.) of 78 nm thick and baked at 100° C. for 60 seconds, forming a resist film of 120 nm thick. The resist film was exposed by means of an ArF excimer laser stepper 307E (Nikon Corp., NA 0.85, a 0.93/0.70, 3/4 annular illumination, 6% halftone mask), post-exposure baked (PEB) at 100° C. for 60 seconds, and puddle developed with a 2.38 wt % aqueous solution of tetramethylammonium hydroxide (TMAH) for 30 seconds. In this way, a 1:1 line-and-space pattern was formed.

The pattern-bearing wafers were observed under a top-down scanning electron microscope (TDSEM). The optimum exposure was an exposure dose (mJ/cm$^2$) which provided a 1:1 resolution at the top and bottom of a 80-nm 1:1 line-and-space pattern. The maximum resolution of the resist was defined as the minimum line width (on-mask size, in increments of 5 nm) of a 1:1 line-and-space pattern that was found resolved and separated at the optimum exposure, with smaller values indicating better resolution. The line edge roughness (LER) of a 80-nm line-and-space pattern was measured using measurement SEM (S-9380 by Hitachi, Ltd.). At each of left and right line edges, 16 measurement points are assigned over a measurement region of 300 nm long. For the left and right edges, an average of deviations of measurement points from the center line is designated L and R, respectively. A square root of $(L^2+R^2)$ gives an LER (nm), with a smaller deviation being better.

Table 8 tabulates the test results (maximum resolution and LER) of the inventive and comparative resist compositions.

TABLE 8

| | | Resist composition | Optimum exposure (mJ/cm$^2$) | Maximum resolution (nm) | LER (nm) |
|---|---|---|---|---|---|
| Example | 3-1 | R-01 | 32 | 75 | 4.2 |
| | 3-2 | R-02 | 30 | 75 | 4.4 |
| | 3-3 | R-03 | 31 | 75 | 5.0 |
| | 3-4 | R-04 | 32 | 75 | 4.4 |
| | 3-5 | R-05 | 30 | 75 | 4.2 |
| | 3-6 | R-06 | 32 | 75 | 4.8 |
| | 3-7 | R-07 | 27 | 75 | 4.2 |
| | 3-8 | R-08 | 30 | 75 | 5.4 |
| | 3-9 | R-09 | 31 | 75 | 5.2 |
| | 3-10 | R-10 | 32 | 75 | 5.0 |
| | 3-11 | R-11 | 30 | 75 | 5.0 |
| | 3-12 | R-12 | 30 | 75 | 4.2 |
| | 3-13 | R-13 | 32 | 75 | 4.8 |
| | 3-14 | R-14 | 33 | 75 | 5.0 |
| | 3-15 | R-15 | 31 | 75 | 5.2 |
| | 3-16 | R-16 | 30 | 75 | 4.4 |
| | 3-17 | R-17 | 33 | 75 | 5.0 |
| | 3-18 | R-18 | 28 | 75 | 5.2 |
| | 3-19 | R-19 | 30 | 75 | 4.8 |
| | 3-20 | R-20 | 36 | 75 | 5.4 |
| | 3-21 | R-21 | 30 | 75 | 4.2 |
| | 3-22 | R-22 | 27 | 75 | 5.0 |
| | 3-23 | R-23 | 30 | 75 | 5.2 |
| | 3-24 | R-24 | 28 | 75 | 5.0 |
| | 3-25 | R-25 | 35 | 75 | 4.8 |
| | 3-26 | R-26 | 36 | 75 | 5.0 |
| | 3-27 | R-27 | 30 | 75 | 5.2 |
| | 3-28 | R-28 | 27 | 75 | 5.0 |
| | 3-29 | R-29 | 27 | 75 | 5.0 |
| | 3-30 | R-30 | 31 | 75 | 5.2 |
| | 3-31 | R-31 | 30 | 75 | 5.2 |
| | 3-32 | R-32 | 33 | 75 | 5.0 |
| | 3-33 | R-33 | 32 | 75 | 4.4 |
| Comparative Example | 3-1 | R-60 | 30 | 80 | 8.0 |
| | 3-2 | R-61 | 32 | 75 | 7.0 |
| | 3-3 | R-62 | 33 | 75 | 7.2 |

The data of Examples in Table 8 demonstrate that the inventive resist compositions exhibit good resolution performance and improved LER when processed by ArF excimer laser lithography. In contrast, the data of Comparative Examples in Table 8 demonstrate that prior art resist compositions fail to meet resolution performance and LER.

It is thus evident that a resist composition comprising as a base resin a polymer containing a sulfonium salt having a polymerizable anion in recurring units according to the invention develops excellent resist characteristics over those formulated in accordance with the prior art.

Evaluation of Resolution on EB Lithography

Examples 3-34 to 3-40 & Comparative Example 3-4

On a 8-inch silicon wafer having an antireflective coating (DUV-44 by Brewer Science) of 610 Å thick coated thereon, each of the inventive resist compositions R-34 to 40 or a comparative resist composition R-63 was spin coated and heat treated at 100° C. for 60 seconds to form a resist film of 150 nm thick. Using an EB lithography system HL-800D (Hitachi Hitechnologies, Ltd.) at an accelerating voltage of 50 keV, exposure was performed on the resist film. The resist film was post-exposure baked (PEB) at 100° C. for 60 seconds and developed for 30 seconds with a 2.38 wt % TMAH aqueous solution, obtaining a positive pattern.

The resist pattern was evaluated as follows. The optimum exposure (sensitivity, Eop) was defined as the exposure dose ($\mu C/cm^2$) which provided a 1:1 resolution at the top and bottom of a 0.12-μm line-and-space pattern. The resolution of the resist was defined as the minimum line width of a line-and-space pattern that was ascertained separate at the optimum exposure. The profile of the resolved resist pattern was evaluated by observing a cross section of the resist under a SEM.

The post-exposure delay (PED) in vacuum was evaluated by exposing the coated wafer on an EB lithography system, holding it in the vacuum system for 24 hours, thereafter effecting PEB and development. The size of lines of a 0.12-μm line-and-space pattern was measured and a percent change thereof was calculated. For example, when the line size increases by 0.012 μm, the change is reported as +10%. A smaller change indicates better stability. The test results are shown in Table 9.

TABLE 9

|  |  | Resist composition | Eop ($\mu C/cm^2$) | Resolution (μm) | Pattern profile | Line size change by PED |
|---|---|---|---|---|---|---|
| Example | 3-34 | R-34 | 18 | 0.08 | Rectangular | 0 |
|  | 3-35 | R-35 | 20 | 0.09 | Rectangular | 0 |
|  | 3-36 | R-36 | 21 | 0.09 | Rectangular | 0 |
|  | 3-37 | R-37 | 22 | 0.08 | Rectangular | 0 |
|  | 3-38 | R-38 | 20 | 0.09 | Rectangular | 0 |
|  | 3-39 | R-39 | 21 | 0.09 | Rectangular | 0 |
|  | 3-40 | R-40 | 20 | 0.09 | Rectangular | 0 |
| Comparative Example | 3-4 | R-63 | 25 | 0.11 | Somewhat rounded top | +10% |

It is evident from Table 9 that the resist composition of the invention is also improved in resolution and vacuum PED when processed by EB lithography. The resist composition is expected to perform equally when processed by the EUV or KrF lithography using polyhydroxystyrene derivatives.

TABLE 10

|  |  | Resist composition | Anion leach-out (ppb) |
|---|---|---|---|
| Example | 3-41 | R-01' | <5 (undetected) |
|  | 3-42 | R-11' | <5 (undetected) |
|  | 3-43 | R-32' | <5 (undetected) |
| Comparative Example | 3-5 | R-60 | 30 |

As is evident from the foregoing results, the photoresist films formed from the resist compositions of the invention are effective for preventing the generated acid from being leached out in water when processed by the immersion lithography using water. It is expected that the resist compositions of the invention undergo little change in pattern profile when processed by the immersion lithography and cause minimal damage to the exposure system.

Japanese Patent Application No. 2008-031322 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

Measurement of Leach-Outs

Examples 3-41 to 3-43 & Comparative Example 3-5

To 100 parts by weight of the resist compositions (R-01, R-11, R-32) prepared above was added 0.2 part by weight of a surfactant (Surfactant-1, shown below) which was insoluble in water and soluble in alkaline developer. Each of the resulting resist compositions (R-01', R-11', R-32') or a comparative resist composition (R-60) was spin coated on a silicon substrate, then baked at 100° C. for 60 seconds to give a photoresist film having a thickness of 120 nm. Using an ArF scanner S305B (Nikon Corp.), the entire surface of the photoresist film was irradiated through an open frame at an energy dose of 50 mJ/cm².

Surfactant-1: a copolymer of 3,3,3-trifluoro-2-hydroxy-1,1-dimethyl-2-trifluoromethylpropyl methacrylate and 2,2,3,3,4,4,5,5-octafluoropentyl methacrylate in a molar ratio of 80:20, with Mw=8,000

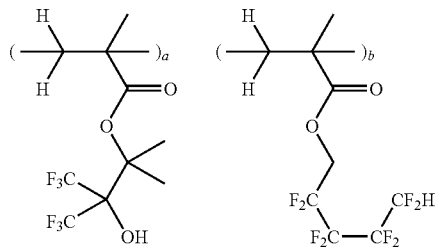

Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of PAG anion in the water was measured by an LC-MS analyzer (Agilent). The anion concentration measured indicates an amount of anions leached out for 60 seconds. The results are shown in Table 10.

The invention claimed is:

1. A positive resist composition comprising as a base resin (A) a polymer comprising recurring units having the general formulae (a), (b), (c), and (d):

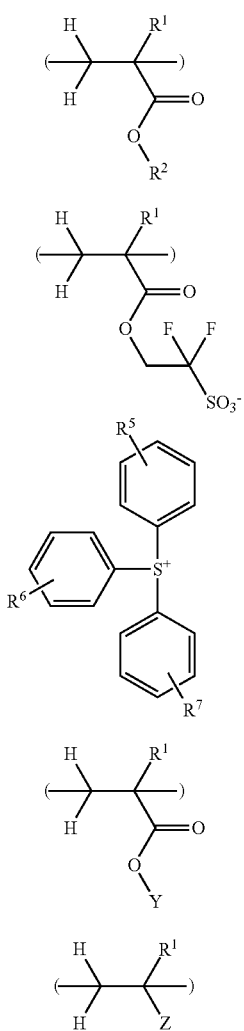

wherein $R^1$ is each independently hydrogen or methyl, $R^2$ is an acid labile group, $R^5$, $R^6$, and $R^7$ are each independently hydrogen or a straight, branched or cyclic monovalent hydrocarbon group of 1 to 20 carbon atoms which may contain a heteroatom, Y is a lactone structure-containing substituent group, and Z is a hydroxyl-containing organic group selected from the following formulae (d-2) through (d-5):

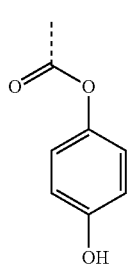

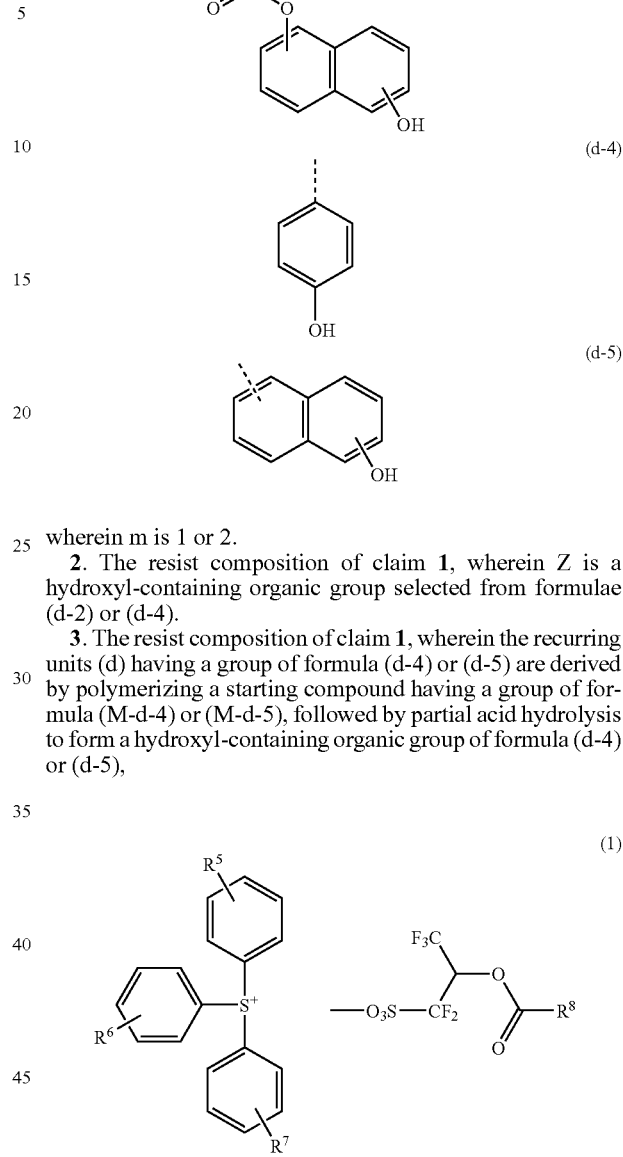

wherein m is 1 or 2.

2. The resist composition of claim 1, wherein Z is a hydroxyl-containing organic group selected from formulae (d-2) or (d-4).

3. The resist composition of claim 1, wherein the recurring units (d) having a group of formula (d-4) or (d-5) are derived by polymerizing a starting compound having a group of formula (M-d-4) or (M-d-5), followed by partial acid hydrolysis to form a hydroxyl-containing organic group of formula (d-4) or (d-5), wherein $R^{2a}$ is 1-alkoxyalkyl of total 2 to 8 carbon atoms, tetrahydropyranyl or tetrahydrofuranyl.

4. The resist composition of claim 1, further comprising a surfactant which is insoluble in water and soluble in an alkaline developer.

5. A pattern forming process comprising the steps of:
applying the positive resist composition of claim 1 onto a substrate to form a coating,
heat treating the coating and exposing it to high-energy radiation through a photomask, and
optionally heat treating the exposed coating and developing it with a developer.

6. A pattern forming process comprising the steps of:
applying the positive resist composition of claim 1 onto a substrate to form a resist coating,
heat treating the resist coating,
applying onto the resist coating a protective coating which is insoluble in water and soluble in an alkaline developer, exposing the coated substrate to high-energy radiation from a projection lens through a photomask while holding water between the substrate and the projection lens,
optionally heat treating, and
developing with a developer.

7. A pattern forming process comprising the steps of:
applying the positive resist composition of claim 1 onto a substrate to form a coating,
heat treating the coating,
imagewise writing with an electron beam,
optionally heat treating the coating, and
developing it with a developer.

* * * * *